United States Patent
Bugade et al.

(10) Patent No.: US 12,164,326 B2
(45) Date of Patent: Dec. 10, 2024

(54) PHASE SHIFTED CLOCK GENERATOR

(71) Applicant: NXP B.V., Eindhoven (NL)

(72) Inventors: Vishwajit Babasaheb Bugade, Kolhapur (IN); Anand Kumar Sinha, Noida (IN); Krishna Thakur, GautamBudh Nagar (IN); Siyaram Sahu, Bari Raisen (IN)

(73) Assignee: NXP B.V., Eindhoven (NL)

( * ) Notice: Subject to any disclaimer, the term of this patent is extended or adjusted under 35 U.S.C. 154(b) by 38 days.

(21) Appl. No.: 18/168,622

(22) Filed: Feb. 14, 2023

(65) Prior Publication Data
US 2024/0192720 A1    Jun. 13, 2024

(30) Foreign Application Priority Data

Dec. 9, 2022 (IN) .............................. 202221071119

(51) Int. Cl.
*H03K 5/01* (2006.01)
*G06F 1/08* (2006.01)
*H03K 5/00* (2006.01)

(52) U.S. Cl.
CPC ................. *G06F 1/08* (2013.01); *H03K 5/01* (2013.01); *H03K 2005/00013* (2013.01); *H03K 2005/00286* (2013.01)

(58) Field of Classification Search
None
See application file for complete search history.

(56) References Cited

U.S. PATENT DOCUMENTS

| | | | | |
|---|---|---|---|---|
| 5,399,995 | A | 3/1995 | Kardontchik et al. | |
| 5,687,202 | A | 11/1997 | Eitrheim | |
| 5,793,238 | A * | 8/1998 | Baker | H03K 5/133 327/284 |
| 5,801,567 | A * | 9/1998 | Kosiec | H03K 5/133 327/263 |
| 6,150,862 | A * | 11/2000 | Vikinski | H03K 5/133 327/276 |
| 6,801,073 | B2 * | 10/2004 | Morgan | H03K 5/133 327/288 |
| 7,173,460 | B2 * | 2/2007 | Jaussi | H03L 7/085 327/158 |

(Continued)

OTHER PUBLICATIONS

Farjad-Rad et al., "A Low-Power Multiplying DLL for Low-Jitter Multigigahertz Clock Generation in Highly Integrated Digital Chips", IEEE Journal of Solid-State Circuits, IEEE, pp. 1804-1812, vol. 37, No. 12; Dec. 1, 2002.

*Primary Examiner* — Thomas J. Hiltunen

(57) ABSTRACT

A phase shifted clock generator that includes a delay circuit, a capacitor, and a control circuit is provided. The delay circuit receives a reference clock signal and generates a phase shifted clock signal. A phase difference between the phase shifted clock signal and the reference clock signal is controlled based on a delay of the delay circuit. The control circuit controls, based on the phase shifted clock signal and the reference clock signal, a control voltage generated at the capacitor. The control circuit controls the control voltage by charging and discharging the capacitor with a constant current. The delay of the delay circuit is controlled based on the control voltage such that the phase difference between the phase shifted clock signal and the reference clock signal is within a predefined range.

19 Claims, 13 Drawing Sheets

(56) References Cited

U.S. PATENT DOCUMENTS

| | | | | |
|---|---|---|---|---|
| 7,622,967 | B2* | 11/2009 | Kimura | H03L 7/0816 |
| | | | | 327/156 |
| 7,671,644 | B2* | 3/2010 | Yan | H03H 11/265 |
| | | | | 327/392 |
| 8,253,466 | B2 | 8/2012 | Jeffries et al. | |
| 9,568,315 | B2* | 2/2017 | Il | G01D 5/12 |
| 11,533,048 | B1* | 12/2022 | Wu | H03K 5/133 |
| 2011/0063005 | A1 | 3/2011 | Huang et al. | |
| 2021/0075429 | A1 | 3/2021 | Han et al. | |

* cited by examiner

PHASE SHIFTED CLOCK GENERATOR

FIELD OF THE DISCLOSURE

The present disclosure relates generally to electronic circuits, and, more particularly, to phase shifted clock generators.

BACKGROUND

An integrated circuit (IC) includes various functional circuits that have different operational topologies to optimize power consumption. In such topologies, various operations of the functional circuits are required to be exclusively triggered at particular instances, which may not be in synchronization with an associated clock signal. For example, a crystal oscillator of an IC may operate in a switched topology, where the crystal is charged and discharged exclusively at crests and troughs of an associated sine wave, respectively, which differ from the edges of a clock output of the crystal oscillator. Inaccurate triggering may result in an undesired operation of the functional circuit (e.g., the crystal oscillator).

BRIEF DESCRIPTION OF THE DRAWINGS

The following detailed description of the embodiments of the present disclosure will be better understood when read in conjunction with the appended drawings. The present disclosure is illustrated by way of example, and not limited by the accompanying figures, in which like references indicate similar elements.

DETAILED DESCRIPTION OF EMBODIMENTS

Figure 1:
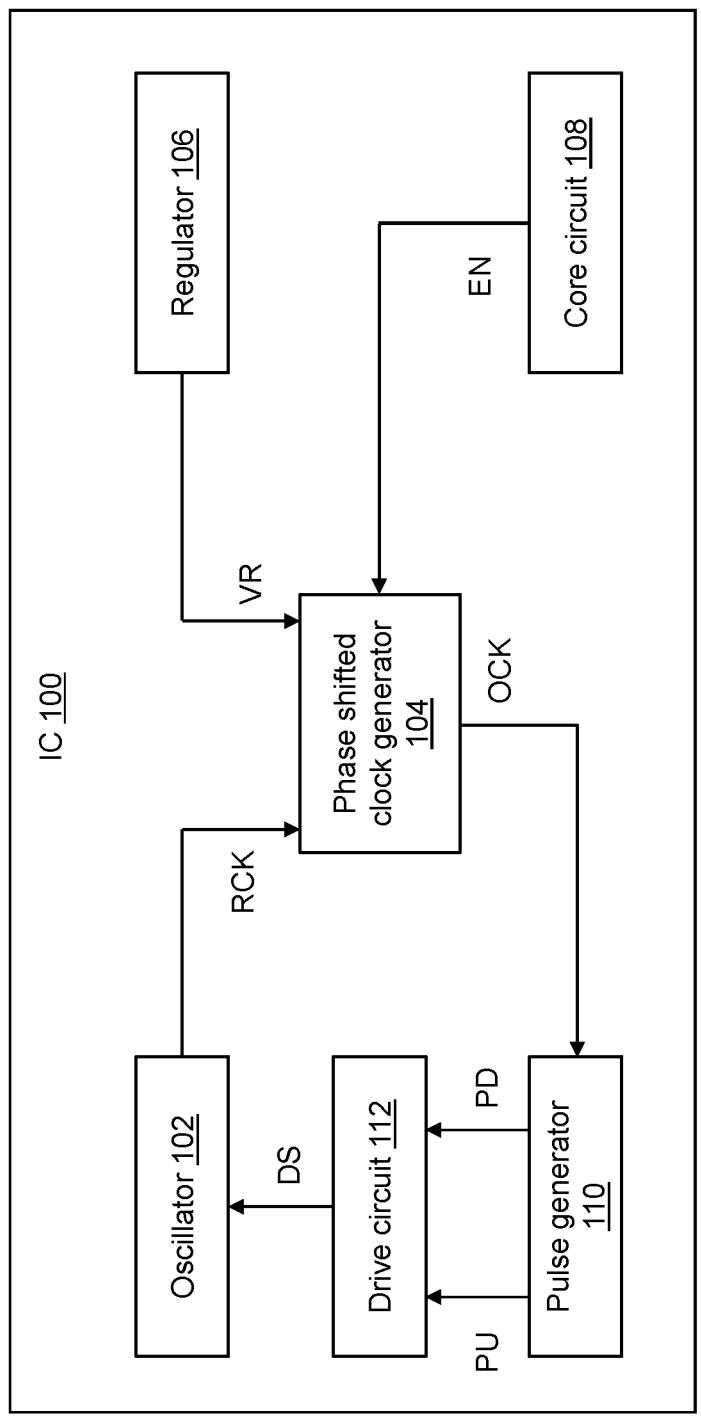
FIG. 1 illustrates a schematic block diagram of an integrated circuit (IC) in accordance with an embodiment of the present disclosure.

The detailed description of the appended drawings is intended as a description of the embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

In an embodiment of the present disclosure, an integrated circuit (IC) is disclosed. The IC may include a phase shifted clock generator. The phase shifted clock generator may include a delay circuit, a first capacitor, and a control circuit that may be coupled to the first capacitor. The delay circuit may be configured to receive a reference clock signal and generate a first phase shifted clock signal. A phase difference between the first phase shifted clock signal and the reference clock signal may be controlled based on a delay of the delay circuit. The control circuit may be configured to control, based on the first phase shifted clock signal and the reference clock signal, a first control voltage generated at the first capacitor by at least one of a group consisting of charging and discharging the first capacitor. Further, the delay of the delay circuit may be controlled based on the first control voltage such that the phase difference between the first phase shifted clock signal and the reference clock signal is within a predefined range.

In another embodiment of the present disclosure, an IC is disclosed. The IC may include a phase shifted clock generator. The phase shifted clock generator may include a delay circuit, a first capacitor, a control circuit that may be coupled to the first capacitor, and a switch that may be coupled to the first capacitor and the delay circuit. The delay circuit may include a plurality of series-coupled inverters and a plurality of transistors coupled to the plurality of series-coupled inverters. The plurality of series-coupled inverters may be configured to receive a reference clock signal and generate a first phase shifted clock signal. A phase difference between the first phase shifted clock signal and the reference clock signal may be controlled based on a delay associated with each transistor. The control circuit may be configured to control, based on the first phase shifted clock signal and the reference clock signal, a first control voltage generated at the first capacitor by at least one of a group consisting of charging and discharging the first capacitor. Further, the delay associated with each transistor is controlled based on a magnitude of a second control voltage that is derived from the first control voltage. When the control circuit is controlling the first control voltage, the switch may be deactivated and the magnitude of the second control voltage may be retained. Conversely, when the first capacitor retains an associated charge, the switch may be activated and the magnitude of the second control voltage may be equivalent to a magnitude of the first control voltage. The delay associated with each transistor may be controlled such that the phase difference between the first phase shifted clock signal and the reference clock signal is within a predefined range.

In some embodiments, the delay of the delay circuit may correspond to a sum of the delay associated with each transistor of the plurality of transistors. The delay circuit may be further configured to receive the second control voltage that is derived from the first control voltage, and the delay of the delay circuit may be controlled based on the magnitude of the second control voltage. The switch may be controlled based on one of a group consisting of the reference clock signal and a second phase shifted clock signal that is derived from and is in phase with the first phase shifted clock signal. The delay of the delay circuit is controlled based on the magnitude of the second control voltage such that a reduction in the magnitude of the second control voltage results in an increase in the delay of the delay circuit. The phase shifted clock generator may further include a second capacitor coupled to the switch and the delay circuit. The magnitude of the second control voltage is retained by way of the second capacitor. The phase shifted clock generator may further include a pair of series-coupled inverters that may be coupled to the delay circuit. The pair of series-coupled inverters may be configured to receive the first phase shifted clock signal and generate the second phase shifted clock signal.

In some embodiments, based on a logic high state of the second phase shifted clock signal, the switch may be deactivated and the control circuit may control the first control voltage such that the first capacitor may be discharged and charged based on logic high and low states of the reference clock signal, respectively. Further, based on a transition of the second phase shifted clock signal to a logic low state, the switch may be activated and the second control voltage may be adjusted to be at the same magnitude as the first control voltage.

In some embodiments, based on a logic high state of the reference clock signal, the switch may be deactivated and the control circuit may control the first control voltage such that the first capacitor may be charged and discharged based on logic low and high states of the second phase shifted clock signal, respectively. Further, based on a transition of the reference clock signal to a logic low state, the switch may be activated and the second control voltage may be adjusted to be at the same magnitude as the first control voltage.

In some embodiments, based on a logic low state of the second phase shifted clock signal, the switch may be deactivated and the control circuit may control the first control voltage such that the first capacitor may be discharged and charged based on logic low and high states of the reference clock signal, respectively. Further, based on a transition of the second phase shifted clock signal to a logic high state, the switch may be activated and the second control voltage may be adjusted to be at the same magnitude as the first control voltage.

In some embodiments, based on a logic low state of the reference clock signal, the switch may be deactivated and the control circuit may control the first control voltage such that the first capacitor may be charged and discharged based on logic high and low states of the second phase shifted clock signal, respectively. Further, based on a transition of the reference clock signal to a logic high state, the switch may be activated and the second control voltage may be adjusted to be at the same magnitude as the first control voltage.

In some embodiments, the control circuit may include a plurality of series-coupled transistors, a current source, and a current sink. The plurality of series-coupled transistors may include first through fourth transistors, with the second and third transistors being coupled to the first capacitor and the first and fourth transistors being coupled to the current source and the current sink, respectively. The plurality of series-coupled transistors may be controlled based on the reference clock signal and the second phase shifted clock signal.

In some embodiments, the fourth and first transistors may be controlled based on the second phase shifted clock signal and an inverted version of the second phase shifted clock signal, respectively. Further, each of the second and third transistors may be controlled based on the reference clock signal. Based on a logic high state of the second phase shifted clock signal and a logic high state of the reference clock signal, the first, third, and fourth transistors may be activated, the second transistor may be deactivated, and the first capacitor may be discharged by way of the current sink. Further, based on the logic high state of the second phase shifted clock signal and a logic low state of the reference clock signal, the first, second, and fourth transistors may be activated, the third transistor may be deactivated, and the first capacitor may be charged by way of the current source.

In some embodiments, the fourth and first transistors may be controlled based on the reference clock signal and an inverted version of the reference clock signal, respectively. Further, each of the second and third transistors may be controlled based on the second phase shifted clock signal. Based on a logic high state of the reference clock signal and a logic high state of the second phase shifted clock signal, the first, third, and fourth transistors may be activated, the second transistor may be deactivated, and the first capacitor may be discharged by way of the current sink. Further, based on the logic high state of the reference clock signal and a logic low state of the second phase shifted clock signal, the first, second, and fourth transistors may be activated, the third transistor may be deactivated, and the first capacitor may be charged by way of the current source.

In some embodiments, the first and fourth transistors may be controlled based on the second phase shifted clock signal and an inverted version of the second phase shifted clock signal, respectively. Further, each of the second and third transistors may be controlled based on an inverted version of the reference clock signal. Based on a logic low state of the second phase shifted clock signal and a logic low state of the reference clock signal, the first, third, and fourth transistors may be activated, the second transistor may be deactivated, and the first capacitor may be discharged by way of the current sink. Further, based on the logic low state of the second phase shifted clock signal and a logic high state of the reference clock signal, the first, second, and fourth transistors may be activated, the third transistor may be deactivated, and the first capacitor may be charged by way of the current source.

In some embodiments, the first and fourth transistors may be controlled based on the reference clock signal and an inverted version of the reference clock signal, respectively. Further, each of the second and third transistors may be controlled based on an inverted version of the second phase shifted clock signal. Based on a logic low state of the reference clock signal and a logic low state of the second phase shifted clock signal, the first, third, and fourth transistors may be activated, the second transistor may be deactivated, and the first capacitor may be discharged by way of the current sink. Further, based on the logic low state of the reference clock signal and a logic high state of the second phase shifted clock signal, the first, second, and fourth transistors may be activated, the third transistor may be deactivated, and the first capacitor may be charged by way of the current source.

In some embodiments, the control circuit may include first and second transistors coupled in series and further coupled to the first capacitor, a first current source configured to source a first current to the first transistor, and a first current sink configured to sink a second current from the second transistor. The control circuit may further include a second current source, a second current sink, and third and fourth transistors, with the third transistor being coupled between the first current source and the second current sink and the fourth transistor being coupled between the second current source and the first current sink. The first through fourth transistors are controlled based on a first trigger signal, a second trigger signal, an inverted version of the first trigger signal, and an inverted version of the second trigger signal, respectively. Based on a logic low state of the first trigger signal, the first and third transistors may be activated and deactivated, respectively, and the first capacitor may be charged by way of the first current source. Conversely, based on a logic high state of the first trigger signal, the first and third transistors may be deactivated and activated, respectively, and a flow of the first current may be continued by way of the third transistor and the second current sink. Similarly, based on a logic high state of the second trigger signal, the second and fourth transistors may be activated and deactivated, respectively, and the first capacitor may be discharged by way of the first current sink. Conversely, based on a logic low state of the second trigger signal, the second and fourth transistors may be deactivated and activated, respectively, and a flow of the second current may be continued by way of the fourth transistor and the second current source.

In some embodiments, the first trigger signal may be at the logic low state based on a logic low state of the reference clock signal and a logic high state of the second phase shifted clock signal. Conversely, the first trigger signal may be at the logic high state based on at least one of a group consisting of a logic high state of the reference clock signal and a logic low state of the second phase shifted clock signal. The second trigger signal may be at the logic high state based on the logic high state of each of the reference clock signal and the second phase shifted clock signal. Conversely, the second trigger signal may be at the logic low state based on at least one of a group consisting of the logic low state of the reference clock signal and the logic low state of the second phase shifted clock signal.

In some embodiments, the first trigger signal may be at the logic low state based on a logic high state of the reference clock signal and a logic low state of the second phase shifted clock signal. Conversely, the first trigger signal may be at the logic high state based on at least one of a group consisting of a logic low state of the reference clock signal and a logic high state of the second phase shifted clock signal. The second trigger signal may be at the logic high state based on the logic high state of each of the reference clock signal and the second phase shifted clock signal. Conversely, the second trigger signal may be at the logic low state based on at least one of a group consisting of the logic low state of the reference clock signal and the logic low state of the second phase shifted clock signal.

In some embodiments, the first trigger signal may be at the logic low state based on a logic high state of the reference clock signal and a logic low state of the second phase shifted clock signal. Conversely, the first trigger signal may be at the logic high state based on at least one of a group consisting of a logic low state of the reference clock signal and a logic high state of the second phase shifted clock signal. The second trigger signal may be at the logic high state based on the logic low state of each of the reference clock signal and the second phase shifted clock signal. Conversely, the second trigger signal may be at the logic low state based on at least one of a group consisting of the logic high state of the reference clock signal and the logic high state of the second phase shifted clock signal.

In some embodiments, the first trigger signal may be at the logic low state based on a logic low state of the reference clock signal and a logic high state of the second phase shifted clock signal. The first trigger signal may be at the logic high state based on at least one of a group consisting of a logic high state of the reference clock signal and a logic low state of the second phase shifted clock signal. The second trigger signal may be at the logic high state based on the logic low state of the reference clock signal and the logic low state of the second phase shifted clock signal. Conversely, the second trigger signal may be at the logic low state based on at least one of a group consisting of the logic high state of the reference clock signal and the logic high state of the second phase shifted clock signal.

In some embodiments, in a steady state of the phase shifted clock generator, the first control voltage is controlled such that a change in the first control voltage during the charging of the first capacitor is equal to and inverse of a change in the first control voltage during the discharging of the first capacitor.

Overview

Conventionally, to accurately trigger various operations of a functional circuit, a phase shifted clock generator, that generates a phase shifted clock signal, is utilized in an integrated circuit (IC). The phase shifted clock signal corresponds to a phase shifted version of a clock signal associated with the functional circuit. For example, for a switched crystal oscillator, the phase shifted clock signal may have a 90° phase shift with respect to a clock output of the crystal oscillator, and may be utilized to charge and discharge the crystal at crests and troughs of an associated sine wave, respectively. However, the phase shifted clock generator may utilize various complex and large-size circuitries (such as digitally-controlled open-loop delay circuits, ring oscillators, or the like) to generate the phase shifted clock signal. Further, such a phase shifted clock generator consumes significant power, and hence, is not suitable for low-power applications (e.g., wearable devices).

Various embodiments of the present disclosure disclose an IC that may include a phase shifted clock generator. The phase shifted clock generator may include a delay circuit, a first capacitor, a control circuit, and a switch. The delay circuit may be configured to receive a reference clock signal and generate a phase shifted clock signal. A phase difference between the phase shifted clock signal and the reference clock signal is controlled based on a delay of the delay circuit. The control circuit may control, based on the phase shifted clock signal and the reference clock signal, a first control voltage generated at the first capacitor by charging and discharging the first capacitor. A second control voltage that is derived from the first control voltage may control the delay of the delay circuit. The switch may be coupled between the delay circuit and the first capacitor, and may be controlled based on the reference clock signal or the phase shifted clock signal. When the switch is activated, magnitudes of the first and second control voltages may be equal, and when the switch is deactivated, the magnitude of the second control voltage is retained. Further, the delay of the delay circuit is controlled based on the second control voltage such that the phase difference between the phase shifted clock signal and the reference clock signal is within a predefined range. The phase shifted clock generator of the present disclosure does not utilize complex and large-size circuitries to generate the phase shifted clock signal. Hence, the complexity and the size of the phase shifted clock generator of the present disclosure are less than that of a conventional phase shifted clock generator that utilizes various complex and large-size circuitries to generate the phase shifted clock signal. Consequently, the power consumption of the phase shifted clock generator of the present disclosure is less than that of the conventional phase shifted clock generator. As a result, the phase shifted clock generator of the present disclosure may be utilized for low-power applications (e.g., wearable devices).

FIG. 1 illustrates a schematic block diagram of an integrated circuit (IC) 100 in accordance with an embodiment of the present disclosure. The IC 100 may include an oscillator 102, a phase shifted clock generator 104, a regulator 106, a core circuit 108, a pulse generator 110, and a drive circuit 112. The IC 100 may be implemented in various devices such as automotive devices, networking devices, mobile devices, wearable devices, or the like.

The oscillator 102 may include suitable circuitry that may be configured to perform one or more operations. For example, the oscillator 102 may be configured to generate a reference clock signal RCK. In an embodiment, the oscillator 102 corresponds to a crystal oscillator operating in a switched topology. The reference clock signal RCK may thus be generated based on a sine wave (not shown) of the crystal oscillator. In the switched topology, a crystal (not shown) of the oscillator 102 is charged and discharged exclusively at particular instances (e.g., at crests and troughs, respectively) of the sine wave, instead of the half/full cycle. The power consumption of the oscillator 102, and in turn, the IC 100 is thus optimized. In such cases, to ensure that the oscillator 102 operates in the desired manner, accurate triggering of charging and discharging of the crystal is paramount. The triggering points (e.g., the crests and troughs of the sine wave) differ from the edges of the reference clock signal RCK and cannot be obtained with simple combinational logic. In an exemplary scenario, the crests and troughs of the sine wave may be present at 90° and 270° angles of the reference clock signal RCK, respectively. Thus, a phase shifted version of the reference clock signal RCK is required for triggering the charging and discharging of the crystal. The phase shifted clock generator 104 may be included in the IC 100 to generate the phase shifted version of the reference clock signal RCK.

The phase shifted clock generator 104 may be coupled to the oscillator 102, and configured to receive the reference clock signal RCK. Further, the phase shifted clock generator 104 may be coupled to the regulator 106 and the core circuit 108, and configured to receive a regulated voltage VR and an enable signal EN, respectively. The regulator 106 may be configured to receive a supply voltage (not shown) from a power supply (not shown) of the IC 100 and generate the regulated voltage VR as the step-down version of the supply voltage. In an embodiment, for the supply voltage of 1.8 Volts (V), the regulated voltage VR may be equal to 0.8 V. The utilization of the regulated voltage VR, instead of the supply voltage, may enable low-voltage implementations of the phase shifted clock generator 104. Further, the core circuit 108 may be configured to generate the enable signal EN based on the initialization of the IC 100. In an embodiment, the enable signal EN is at a logic low state while the IC 100 is being initialized, and transitions to a logic high state when the initialization is complete (e.g., when the regulated voltage VR and the reference clock signal RCK are stable). The enable signal EN may thus initiate the operation of the phase shifted clock generator 104. Based on the reference clock signal RCK, the regulated voltage VR, and the enable signal EN, the phase shifted clock generator 104 may be further configured to generate an output clock signal OCK. The output clock signal OCK corresponds to a phase shifted clock signal, with a phase difference between the output clock signal OCK and the reference clock signal RCK being within a predefined range. In an example, the predefined range corresponds to 72° to 108°. However, the predefined range may have different values in other embodiments. In an exemplary scenario, the phase difference between the output and reference clock signals OCK and RCK is 90°. In such a scenario, the output clock signal OCK may correspond to a quadrature phase shifted clock signal and the phase shifted clock generator 104 may correspond to a quadrature phase shifted clock generator. Thus, the edges of the output clock signal OCK may be aligned with the crests and troughs of the sine wave of the oscillator 102. The phase shifted clock generator 104 may include a delay circuit and a first capacitor. The delay circuit may generate an intermediate clock signal as a phase shifted version of the reference clock signal RCK. A phase difference between the intermediate clock signal and the reference clock signal RCK is controlled based on a delay of the delay circuit. Further, the output clock signal OCK may be derived from the intermediate clock signal. In an embodiment, the output clock signal OCK is in phase with the intermediate clock signal. Thus, the intermediate clock signal corresponds to a first phase shifted clock signal that is generated by delaying the reference clock signal RCK, and the output clock signal OCK corresponds to a second phase shifted clock signal that is derived from and is in phase with the intermediate clock signal. Based on the output and reference clock signals OCK and RCK, the first capacitor is charged and discharged and a first control voltage generated at the first capacitor is controlled. Further, the delay of the delay circuit may be controlled based on the first control voltage such that the phase difference between the intermediated clock signal (and in turn, the output clock signal OCK) and the reference clock signal RCK is within the predefined range. The delay circuit, the first capacitor, the intermediate clock signal, and the first control voltage are shown later in FIGS. 2, 3, 5, 6, 8, 9, 11, and 12. FIGS. 2, 3, 5, 6, 8, 9, 11, and 12 illustrate different implementations of the phase shifted clock generator 104. The pulse generator 110 may be coupled to the phase shifted clock generator 104. The pulse generator 110 may include suitable circuitry that may be configured to perform one or more operations. For example, the pulse generator 110 may be configured to receive the output clock signal OCK from the phase shifted clock generator 104. Based on the output clock signal OCK, the pulse generator 110 may be further configured to generate a pump-up signal PU and a pump-down signal PD. The pump-up and pump-down signals PU and PD may correspond to pulse signals that are generated at the rising and falling edges of the output clock signal OCK, respectively.

The drive circuit 112 may be coupled to the pulse generator 110 and the oscillator 102. The drive circuit 112 may include suitable circuitry that may be configured to perform one or more operations. For example, the drive circuit 112 may be configured to receive the pump-up and pump-down signals PU and PD from the pulse generator 110. The drive circuit 112 may be further configured to generate a drive signal DS based on the pump-up and pump-down signals PU and PD and provide the drive signal DS to the oscillator 102 to trigger the charging and discharging of the crystal, and in turn, facilitate the generation of the reference clock signal RCK. In an embodiment, the drive signal DS corresponds to a current that facilitates the charging and discharging of the crystal. For example, based on a logic high state of the pump-up signal PU, the current is sourced to the crystal to charge the crystal, whereas, based on a logic high state of the pump-down signal PD, the current is sunk from the crystal to discharge the crystal.

Although it is described that the phase shifted clock signal (e.g., the output clock signal OCK) is utilized for triggering the operations of the oscillator 102, the scope of the present disclosure is not limited to it. In various other embodiments, the output clock signal OCK may be utilized for triggering operations of various other functional circuits (e.g., encoders, decoders, or the like) that require a phase shifted clock signal, without deviating from the scope of the present disclosure.

Figure 2:
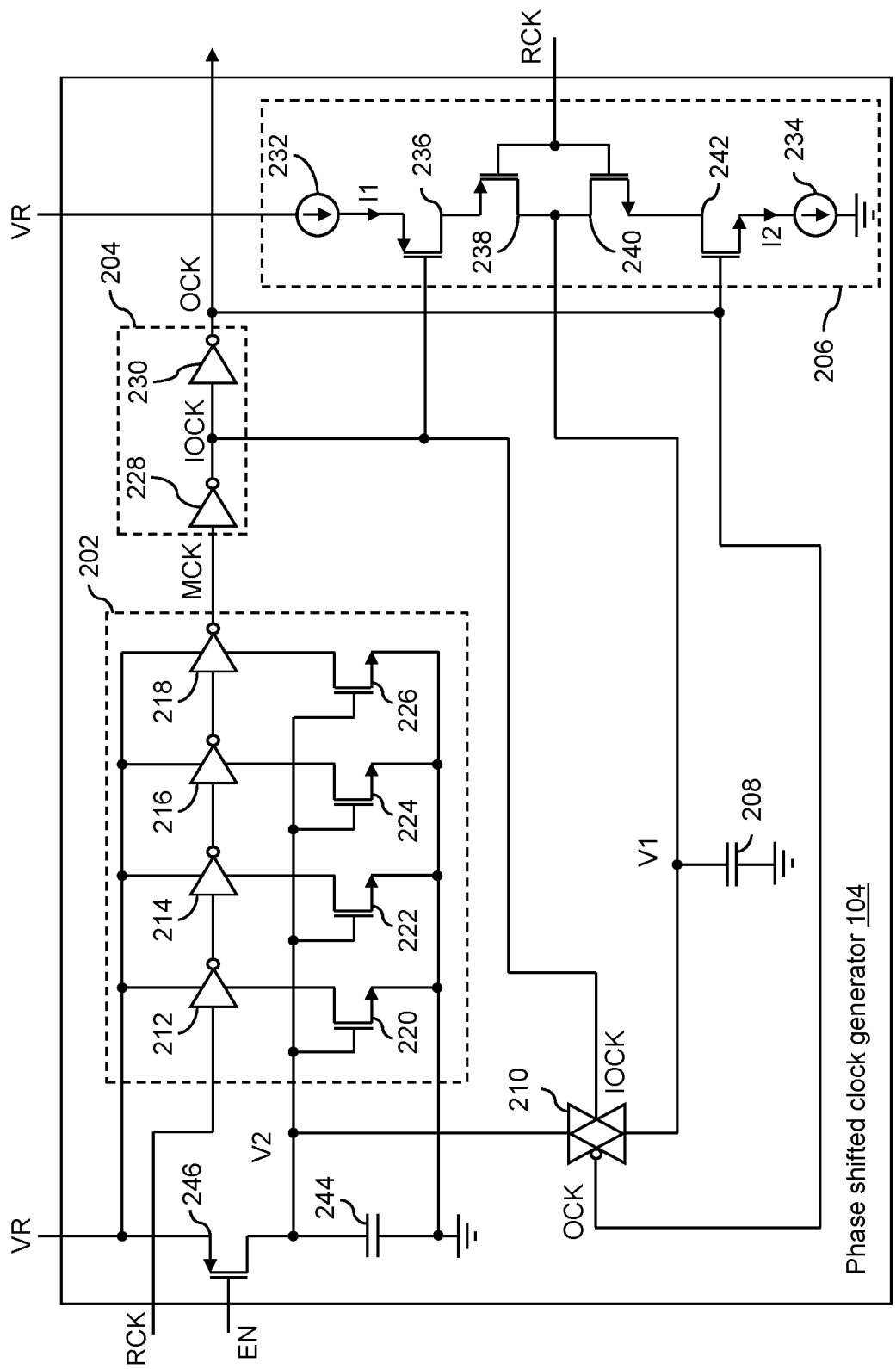
FIG. 2 illustrates a schematic circuit diagram of a phase shifted clock generator of the IC of FIG. 1 in accordance with an embodiment of the present disclosure.

FIG. 2 illustrates a schematic circuit diagram of the phase shifted clock generator 104 in accordance with an embodiment of the present disclosure. The phase shifted clock generator 104 may include the delay circuit (hereinafter referred to and designated as the "delay circuit 202"), a pair of series-coupled inverters 204, a first control circuit 206, the first capacitor (hereinafter referred to and designated as the "first capacitor 208"), and a switch 210. The first control voltage (hereinafter referred to and designated as the "first control voltage V1") may be generated at the first capacitor 208. In other words, the first control voltage V1 may be indicative of the state of charge in the first capacitor 208.

The delay circuit 202 may be coupled to the oscillator 102 and the regulator 106, and configured to receive the reference clock signal RCK and the regulated voltage VR, respectively. The delay circuit 202 may be further configured to receive a second control voltage V2 that is derived from the first control voltage V1. Based on the second control voltage V2, the reference clock signal RCK, and the regulated voltage VR, the delay circuit 202 may be further configured to generate the intermediate clock signal (hereinafter referred to and designated as the "intermediate clock signal MCK"). The phase difference between the intermediate clock signal MCK and the reference clock signal RCK is controlled based on the delay of the delay circuit 202. Further, the delay of the delay circuit 202 is controlled based on a magnitude of the second control voltage V2.

The delay circuit 202 may include first through fourth inverters 212-218. Each of the first through fourth inverters 212-218 may include a high supply terminal, a low supply terminal, an input terminal, and an output terminal. The high supply terminals of the first through fourth inverters 212-218 may be coupled to the regulator 106, and configured to receive the regulated voltage VR. The output terminal of the first inverter 212 may be coupled to the input terminal of the second inverter 214. Further, the input and output terminals of the third inverter 216 may be coupled to the output terminal of the second inverter 214 and the input terminal of the fourth inverter 218, respectively. In other words, the first through fourth inverters 212-218 may be coupled in series. Thus, the first through fourth inverters 212-218 may be collectively referred to as a "plurality of series-coupled inverters 212-218". The plurality of series-coupled inverters 212-218 may be coupled to the oscillator 102, and configured to receive the reference clock signal RCK and generate the intermediate clock signal MCK. For example, the input terminal of the first inverter 212 may be coupled to the oscillator 102, and configured to receive the reference clock signal RCK, whereas, the fourth inverter 218 may be configured to generate the intermediate clock signal MCK at the output terminal thereof.

The delay circuit 202 may further include first through fourth transistors 220-226. The first through fourth transistors 220-226 may be collectively referred to as a "plurality of transistors 220-226". The plurality of transistors 220-226 may be coupled to the plurality of series-coupled inverters 212-218. In an embodiment, each of the first through fourth transistors 220-226 is an n-channel metal-oxide-semiconductor (NMOS) transistor having source, gate, and drain terminals. The drain terminals of the first through fourth transistors 220-226 may be coupled to the first through fourth inverters 212-218 (e.g., the low supply terminals of the first through fourth inverters 212-218), respectively. The source terminals of the first through fourth transistors 220-226 may be coupled to a ground terminal, whereas, the gate terminals of the first through fourth transistors 220-226 may be configured to receive the second control voltage V2.

The second control voltage V2 may control the plurality of transistors 220-226. For example, the magnitude of the second control voltage V2 may control a drive strength of each of the plurality of transistors 220-226. As the first through fourth transistors 220-226 are coupled to the low supply terminals of the first through fourth inverters 212-218, the drive strengths of the first through fourth transistors 220-226 may control the delays at the output terminals of the first through fourth inverters 212-218, respectively. In an example, the delays may be introduced at falling edges of output signals of the first through fourth inverters 212-218. Thus, each transistor has a delay associated therewith that is controlled based on the magnitude of the second control voltage V2. Further, the delay of the delay circuit 202 corresponds to a sum of the delay associated with each of the plurality of transistors 220-226. The pair of series-coupled inverters 204 may be coupled to the delay circuit 202, and configured to receive the intermediate clock signal MCK and generate the output clock signal OCK. The pair of series-coupled inverters 204 may include a fifth inverter 228 and a sixth inverter 230, each including input and output terminals. The input terminal of the fifth inverter 228 may be coupled to the delay circuit 202 (e.g., the output terminal of the fourth inverter 218), and configured to receive the intermediate clock signal MCK. The output terminal of the fifth inverter 228 may be coupled to the input terminal of the sixth inverter 230. Further, the sixth inverter 230 may be configured to generate the output clock signal OCK at the output terminal thereof. Each of the fifth and sixth inverters 228 and 230 may further include high and low supply terminals (not shown). The high supply terminals of the fifth and sixth inverters 228 and 230 may be coupled to the regulator 106, and configured to receive the regulated voltage VR, whereas, the low supply terminals of the fifth and sixth inverters 228 and 230 may be coupled to the ground terminal. As a result, the output clock signal OCK may be in phase with the intermediate clock signal MCK and may have a sharper square-shaped waveform as compared to the intermediate clock signal MCK. Further, the fifth inverter 228 may be configured to generate an inverted output clock signal IOCK, that is an inverted version of the output clock signal OCK, at the output terminal thereof.

The first control circuit 206 may be coupled to the oscillator 102, the regulator 106, the pair of series-coupled inverters 204, and the first capacitor 208. The first control circuit 206 may be configured to receive the inverted output clock signal IOCK and the output clock signal OCK from the pair of series-coupled inverters 204, the regulated voltage VR from the regulator 106, and the reference clock signal RCK from the oscillator 102. Further, the first control circuit 206 may be configured to control the first control voltage V1 generated at the first capacitor 208 based on the inverted output clock signal IOCK, the output clock signal OCK, the regulated voltage VR, and the reference clock signal RCK. As the inverted output clock signal IOCK and the output clock signal OCK are derived from the intermediate clock signal MCK, the first control circuit 206 may thus control the first control voltage V1 based on the intermediate clock signal MCK, the regulated voltage VR, and the reference clock signal RCK. The first control circuit 206 controls the first control voltage V1 by charging and discharging the first capacitor 208.

The first control circuit 206 may include a first current source 232 and a first current sink 234. The first current source 232 may be coupled to the regulator 106, whereas, the first current sink 234 may be coupled to the ground terminal and the regulator 106. The first current source 232 may be configured to receive the regulated voltage VR and a first mirror voltage (not shown) from the regulator 106, and the first current sink 234 may be configured to receive a second mirror voltage (not shown) from the regulator 106. In an embodiment, the first current source 232 and the first current sink 234 may correspond to branches of first and second current mirror circuits (not shown), respectively, with the remaining portion of the first and second current mirror circuits included in the regulator 106. The regulator 106 may thus be further configured to generate the first and second mirror voltages. Based on the regulated voltage VR and the first mirror voltage, the first current source 232 may be further configured to source a first current I1. Similarly, based on the second mirror voltage, the first current sink 234 may be further configured to sink a second current I2. In an embodiment, the first and second currents I1 and I2 are equal. In an example, the first and second currents I1 and I2 correspond to 4 nano amperes (nA). However, the first and second currents I1 and I2 may have other values.

The first control circuit 206 may further include a fifth transistor 236, a sixth transistor 238, a seventh transistor 240, and an eighth transistor 242. In an embodiment, the fifth and sixth transistors 236 and 238 are p-channel metal-oxide-semiconductor (PMOS) transistors, and the seventh and eighth transistors 240 and 242 are NMOS transistors. Each of the fifth through eighth transistors 236-242 includes source, drain, and gate terminals. The source and drain terminals of the fifth transistor 236 may be coupled to the first current source 232 and the source terminal of the sixth transistor 238, respectively. Further, the drain and source terminals of the seventh transistor 240 may be coupled to the drain terminals of the sixth and eighth transistors 238 and 242, respectively. Additionally, the source terminal of the eighth transistor 242 may be coupled to the first current sink 234. Thus, the fifth through eighth transistors 236-242 may be coupled in series, and are collectively referred to as a "plurality of series-coupled transistors 236-242". The plurality of series-coupled transistors 236-242 are thus coupled between the first current source 232 and the first current sink 234 such that the first current I1 is sourced to the fifth transistor 236 and the second current I2 is sunk from the eighth transistor 242. The sixth and seventh transistors 238 and 240 (e.g., the drain terminals of the sixth and seventh transistors 238 and 240) may be further coupled to the first capacitor 208. The gate terminal of the fifth transistor 236 may be coupled to the output terminal of the fifth inverter 228, and configured to receive the inverted output clock signal IOCK. Thus, the fifth transistor 236 may be controlled based on the inverted output clock signal IOCK. Further, the gate terminal of each of the sixth and seventh transistors 238 and 240 may be coupled to the oscillator 102, and configured to receive the reference clock signal RCK. Thus, each of the sixth and seventh transistors 238 and 240 may be controlled based on the reference clock signal RCK. Similarly, the gate terminal of the eighth transistor 242 may be coupled to the output terminal of the sixth inverter 230, and configured to receive the output clock signal OCK. The eighth transistor 242 may thus be controlled based on the output clock signal OCK. Based on the activation of the fifth and sixth transistors 236 and 238, the first capacitor 208 may be charged by way of the first current source 232 (e.g., the first current I1 is sourced to the first capacitor 208). Similarly, based on the activation of the seventh and eighth transistors 240 and 242, the first capacitor 208 may be discharged by way of the first current sink 234 (e.g., the second current I2 is sunk from the first capacitor 208).

As the fifth and sixth transistors 236 and 238 are PMOS transistors and the seventh and eighth transistors 240 and 242 are NMOS transistors, the fifth and eighth transistors 236 and 242 may be simultaneously activated or deactivated, whereas, at any instance, exclusively one of the sixth and seventh transistors 238 and 240 may be activated. For example, based on a logic high state of the output clock signal OCK and a logic high state of the reference clock signal RCK, the fifth, seventh, and eighth transistors 236, 240, and 242 may be activated, the sixth transistor 238 may be deactivated, and the first capacitor 208 may be discharged by way of the first current sink 234. Further, based on the logic high state of the output clock signal OCK and a logic low state of the reference clock signal RCK, the fifth, sixth, and eighth transistors 236, 238, and 242 may be activated, the seventh transistor 240 may be deactivated, and the first capacitor 208 may be charged by way of the first current source 232. Thus, based on the logic high state of the output clock signal OCK, the first control circuit 206 controls the first control voltage V1 by charging and discharging the first capacitor 208. The first capacitor 208 is discharged and charged based on the logic high and low states of the reference clock signal RCK, respectively. Additionally, based on a logic low state of the output clock signal OCK, the fifth and eighth transistors 236 and 242 may be deactivated, and the first capacitor 208 is neither charged nor discharged (e.g., the first capacitor 208 retains an associated charge and the first control voltage V1 may remain unchanged).

The first capacitor 208 may include a first terminal coupled to the first control circuit 206 (e.g., the drain terminals of the sixth and seventh transistors 238 and 240) and the switch 210. The first capacitor 208 may further include a second terminal coupled to the ground terminal. In an embodiment, the first capacitor 208 may have a capacitance equivalent to 4 picofarads (pF). However, the capacitance of the first capacitor 208 may be different in other embodiments.

The switch 210 may be coupled to the delay circuit 202 and the first capacitor 208, and the pair of series-coupled inverters 204. In an embodiment, the switch 210 corresponds to a transmission gate. The switch 210 may thus include first and second active terminals coupled to the first capacitor 208 and the delay circuit 202 (e.g., the gate terminals of the plurality of transistors 220-226), respectively. The switch 210 may further include positive and negative control terminals coupled to the output terminals of the fifth and sixth inverters 228 and 230, and configured to receive the inverted output clock signal IOCK and the output clock signal OCK, respectively. The activation and deactivation of the switch 210 may thus be controlled based on the output clock signal OCK. When the switch 210 is activated, the magnitude of the second control voltage V2 is equivalent to the magnitude of the first control voltage V1. Conversely, when the switch 210 is deactivated, the magnitude of the second control voltage V2 is retained. Based on the logic high and low states of the output clock signal OCK, the switch 210 may be deactivated and activated, respectively. Based on the logic high state of the output clock signal OCK, the first control circuit 206 controls the first control voltage V1 by charging and discharging the first capacitor 208. In such a scenario, the switch 210 is deactivated to ensure that the changes in the first control voltage V1 do not affect the second control voltage V2 (e.g., the second control voltage V2 is retained). Further, based on the transition of the output clock signal OCK to the logic low state, the switch 210 is activated and the second control voltage V2 may be adjusted to be at the same magnitude as the first control voltage V1.

In the absence of the switch 210, when the first control circuit 206 is controlling the first control voltage V1, the second control voltage V2 may also change. In such a scenario, the magnitude of the second control voltage V2 during the rising of the reference clock signal RCK may be constant but may be changing during the falling of the reference clock signal RCK. As a result, rise and fall delays may be different which may lead to non-idealities in the IC 100. The switch 210 is included in the phase shifted clock generator 104 to ensure that the second control voltage V2 remains stable when the first control voltage V1 is being altered. Additionally, the control of the second control voltage V2 in an aforementioned manner ensures that process-voltage-temperature variations in the IC 100 do not result in significant variations in the phase difference between the output and reference clock signals OCK and RCK.

The phase shifted clock generator 104 may further include a second capacitor 244. The second capacitor 244 may include a first terminal coupled to the second active terminal of the switch 210 and the delay circuit 202 (e.g., the gate terminals of the plurality of transistors 220-226). The second capacitor 244 may further include a second terminal coupled to the ground terminal. The second capacitor 244 may be configured to store the second control voltage V2. Thus, when the switch 210 is deactivated, the magnitude of the second control voltage V2 is retained by way of the second capacitor 244. In an embodiment, the second capacitor 244 may have a capacitance equivalent to 1 pF. However, the capacitance of the second capacitor 244 may be different in other embodiments.

The phase shifted clock generator 104 may further include a ninth transistor 246 that may be coupled to the core circuit 108, the regulator 106, and the first terminal of the second capacitor 244. In an embodiment, the ninth transistor 246 corresponds to a PMOS transistor having source, gate, and drain terminals. The source and gate terminals of the ninth transistor 246 may be coupled to the regulator 106 and the core circuit 108, and configured to receive the regulated voltage VR and the enable signal EN, respectively. Further, the drain terminal of the ninth transistor 246 may be coupled to the first terminal of the second capacitor 244, the second active terminal of the switch 210, and the gate terminals of the plurality of transistors 220-226. The ninth transistor 246 may facilitate the initialization of the phase shifted clock generator 104. For example, during the initialization of the IC 100, the enable signal EN may be at the logic low state. The ninth transistor 246 may thus be activated and the second control voltage V2 may be pulled to the regulated voltage VR. In such a scenario, the delay introduced by each of the plurality of transistors 220-226 may be zero, and the intermediate clock signal MCK may be in phase with the reference clock signal RCK. When the enable signal EN transitions to the logic high state (e.g., when the IC 100 is initialized), the ninth transistor 246 may be deactivated. Further, it is assumed that during the initialization, the reference clock signal RCK attains a stable state. Thus, after the second control voltage V2 is pulled to the regulated voltage VR, based on a subsequent logic low state of the output clock signal OCK, the magnitudes of the first and second control voltages V1 and V2 may be equal. Thus, the first control voltage V1 may also be pulled to the regulated voltage VR. The delay of the delay circuit 202 is thus controlled based on the second control voltage V2 (and in turn, the first control voltage V1) such that the phase difference between the output and reference clock signals OCK and RCK is within the predefined range. The phase difference between the output and reference clock signals OCK and RCK is further controlled based on a duty cycle of the reference clock signal RCK. In an exemplary embodiment, when the duty cycle of the reference clock signal RCK corresponds to 0.5, the phase difference may be equal to 90°. Conversely, when the duty cycle corresponds to 0.4 and 0.6, the phase difference may be equal to 72° and 108°, respectively. However, the phase difference for various duty cycle values may be different in other embodiments.

Variations in the Phase Shifted Clock Generator 104 of FIG. 2:

In a first variation, the delay circuit 202 may include less than or more than four inverters and four transistors.

In a second variation, the phase shifted clock generator 104 may include any other even number of series-coupled inverters instead of including the single pair of series-coupled inverters 204.

In a third variation, the switch 210 may be implemented in different ways (e.g., a PMOS transistor, an NMOS transistor, or the like) apart from a transmission gate.

In a fourth variation, the phase shifted clock generator 104 may include another transistor (not shown) with similar functionalities as that of the ninth transistor 246. Such a transistor may include source and gate terminals configured to receive the regulated voltage VR and the enable signal EN, respectively, and a drain terminal coupled to the first terminal of the switch 210. The first control voltage V1 is thus pulled to the regulated voltage VR during the initialization of the IC 100.

Figure 3:
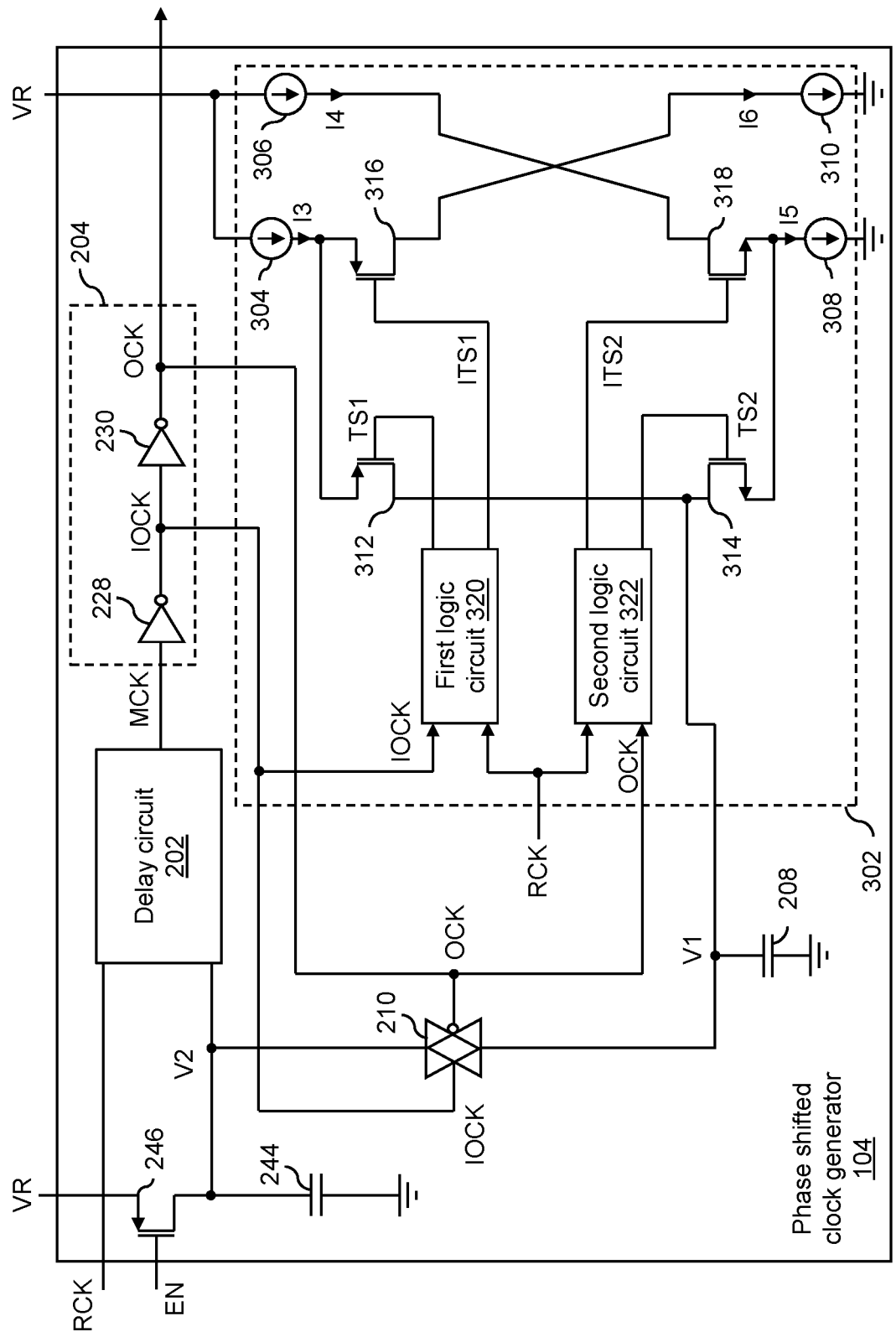
FIG. 3 illustrates a schematic circuit diagram of the phase shifted clock generator in accordance with another embodiment of the present disclosure.

FIG. 3 illustrates a schematic circuit diagram of the phase shifted clock generator 104 in accordance with another embodiment of the present disclosure. As illustrated in FIG. 3, the phase shifted clock generator 104 may include the delay circuit 202, the pair of series-coupled inverters 204, a second control circuit 302, the first and second capacitors 208 and 244, the switch 210, and the ninth transistor 246.

The structure and functionalities of the delay circuit 202, the pair of series-coupled inverters 204, the first and second capacitors 208 and 244, the switch 210, and the ninth transistor 246 remain same as described in FIG. 2. The difference between the phase shifted clock generator 104 of FIGS. 2 and 3 is that the first control circuit 206 in the phase shifted clock generator 104 of FIG. 2 is replaced with the second control circuit 302 in the phase shifted clock generator 104 of FIG. 3. The second control circuit 302 may have the same functionality but different structure as compared to the first control circuit 206. The second control circuit 302 may include a second current source 304, a third current source 306, a second current sink 308, and a third current sink 310. The second and third current sources 304 and 306 may be structurally similar to the first current source 232 of the first control circuit 206, whereas the second and third current sinks 308 and 310 may be structurally similar to the first current sink 234 of the first control circuit 206. Thus, the second and third current sources 304 and 306 may be configured to source third and fourth currents I3 and I4, and the second and third current sinks 308 and 310 may be configured to sink fifth and sixth currents I5 and I6, respectively. In an embodiment, the third through sixth currents I3-I6 are equal. In an example, the third through sixth currents I3-I6 correspond to 4 nA. However, the third through sixth currents I3-I6 may have other values. The second control circuit 302 may further include a tenth transistor 312, an eleventh transistor 314, a twelfth transistor 316, and a thirteenth transistor 318. In an embodiment, the tenth and twelfth transistors 312 and 316 are PMOS transistors, and the eleventh and thirteenth transistors 314 and 318 are NMOS transistors. Each of the tenth through thirteenth transistors 312-318 may include source, drain, and gate terminals.

The tenth and eleventh transistors 312 and 314 are coupled in series. In other words, the drain terminals of the tenth and eleventh transistors 312 and 314 may be coupled to each other and further coupled to the first capacitor 208. Further, the source terminals of the tenth and eleventh transistors 312 and 314 may be coupled to the second current source 304 and the second current sink 308, respectively. Thus, the second current source 304 may source the third current I3 to the tenth transistor 312 and the second current sink 308 may sink the fifth current I5 from the eleventh transistor 314. Further, the gate terminals of the tenth and eleventh transistors 312 and 314 may be configured to receive first and second trigger signals TS1 and TS2, respectively. In other words, the tenth and eleventh transistors 312 and 314 may be controlled based on the first and second trigger signals TS1 and TS2, respectively. The source and drain terminals of the twelfth transistor 316 may be coupled to the second current source 304 and the third current sink 310, respectively. Thus, the third current I3 may be sourced to and the sixth current I6 may be sunk from the twelfth transistor 316. Similarly, the source and drain terminals of the thirteenth transistor 318 may be coupled to the second current sink 308 and the third current source 306, respectively. Thus, the fourth current I4 may be sourced to and the fifth current I5 may be sunk from the thirteenth transistor 318. Further, the gate terminals of the twelfth and thirteenth transistors 316 and 318 may be configured to receive an inverted first trigger signal ITS1 and an inverted second trigger signal ITS2, respectively. The inverted first trigger signal ITS1 and the inverted second trigger signal ITS2 are inverted versions of the first and second trigger signals TS1 and TS2, respectively. Thus, the twelfth and thirteenth transistors 316 and 318 may be controlled based on the inverted first trigger signal ITS1 and the inverted second trigger signal ITS2, respectively.

The second control circuit 302 may further include a first logic circuit 320 and a second logic circuit 322. The first logic circuit 320 may be configured to generate the first trigger signal TS1 and the inverted first trigger signal ITS1, whereas the second logic circuit 322 may be configured to generate the second trigger signal TS2 and the inverted second trigger signal ITS2. The first logic circuit 320 may be coupled to the output terminal of the fifth inverter 228, the oscillator 102, and the gate terminals of the tenth and twelfth transistors 312 and 316. The first logic circuit 320 may be configured to receive the inverted output clock signal IOCK and the reference clock signal RCK from the output terminal of the fifth inverter 228 and the oscillator 102, respectively. Based on the inverted output clock signal IOCK and the reference clock signal RCK, the first logic circuit 320 may generate the first trigger signal TS1 and the inverted first trigger signal ITS1. Further, the first logic circuit 320 may be configured to provide the first trigger signal TS1 and the inverted first trigger signal ITS1 to the gate terminals of the tenth and twelfth transistors 312 and 316, respectively. In an embodiment, the first trigger signal TS1 corresponds to a logical OR of the inverted output clock signal IOCK and the reference clock signal RCK. Thus, the first trigger signal TS1 may be at a logic low state based on the logic low state of the reference clock signal RCK and the logic high state of the output clock signal OCK. Conversely, the first trigger signal TS1 may be at a logic high state based on the logic high state of the reference clock signal RCK and/or the logic low state of the output clock signal OCK. In an embodiment, the first logic circuit 320 may include a NOR gate and an inverter coupled to the output of the NOR gate, with the output of the NOR gate corresponding to the inverted first trigger signal ITS1 and the output of the inverter corresponding to the first trigger signal TS1. However, the first logic circuit 320 may be implemented in different ways in other embodiments. The second logic circuit 322 may be coupled to the output terminal of the sixth inverter 230, the oscillator 102, and the gate terminals of the eleventh and thirteenth transistors 314 and 318. The second logic circuit 322 may be configured to receive the output clock signal OCK and the reference clock signal RCK from the output terminal of the sixth inverter 230 and the oscillator 102, respectively. Based on the output and reference clock signals OCK and RCK, the second logic circuit 322 may generate the second trigger signal TS2 and the inverted second trigger signal ITS2. Further, the second logic circuit 322 may be configured to provide the second trigger signal TS2 and the inverted second trigger signal ITS2 to the gate terminals of the eleventh and thirteenth transistors 314 and 318, respectively. In an embodiment, the second trigger signal TS2 corresponds to a logical AND of the output and reference clock signals OCK and RCK. Thus, the second trigger signal TS2 may be at a logic high state based on the logic high state of each of the output and reference clock signals OCK and RCK. Conversely, the second trigger signal TS2 may be at a logic low state based on the logic low state of at least one of the output and reference clock signals OCK and RCK. In an embodiment, the second logic circuit 322 may include a NAND gate and an inverter coupled to the output of the NAND gate, with the output of the NAND gate corresponding to the inverted second trigger signal ITS2 and the output of the inverter corresponding to the second trigger signal TS2. However, the second logic circuit 322 may be implemented in different ways in other embodiments. Thus, based on the logic high state of each of the output and reference clock signals OCK and RCK, the first and second trigger signals TS1 and TS2 may be at the logic high state. As a result, the eleventh and twelfth transistors 314 and 316 may be activated and the tenth and thirteenth transistors 312 and 318 may be deactivated. Thus, the first capacitor 208 may be discharged by way of the second current sink 308, and the flow of the third current I3 is continued by way of the twelfth transistor 316 and the third current sink 310 (e.g., the sixth current I6). Further, based on the logic high state of the output clock signal OCK and the logic low state of the reference clock signal RCK, the first and second trigger signals TS1 and TS2 may be at the logic low state. As a result, the eleventh and twelfth transistors 314 and 316 may be deactivated and the tenth and thirteenth transistors 312 and 318 may be activated. Thus, the first capacitor 208 may be charged by way of the second current source 304, and the flow of the fifth current I5 may be continued by way of the thirteenth transistor 318 and the third current source 306 (e.g., the fourth current I4). In other words, based on the logic high state of the output clock signal OCK, the second control circuit 302 controls the first control voltage V1 by charging and discharging the first capacitor 208. The first capacitor 208 is discharged and charged based on the logic high and low states of the reference clock signal RCK, respectively. Based on the logic low state of the output clock signal OCK, the first and second trigger signals TS1 and TS2 may be at the logic high and low states, respectively. Thus, the tenth and eleventh transistors 312 and 314 may be deactivated, and the first capacitor 208 retains the associated charge. Further, the twelfth and thirteenth transistors 316 and 318 may be activated. Hence, the flow of the third and fifth currents I3 and I5 may be continued. As the flow of the third and fifth currents I3 and I5 may be continued even when the tenth and eleventh transistors 312 and 314 are deactivated, charge accumulation at the source terminals of the respective tenth and eleventh transistors 312 and 314 is prevented. Both the first and second control circuits 206 and 302 control the first control voltage V1 during the logic high state of the output clock signal OCK, and during the logic low state of the output clock signal OCK, the first control voltage V1 may be retained. The functionality of the phase shifted clock generator 104 of FIGS. 2 and 3 remains same, and is explained in conjunction with FIG. 4.

Figure 4:
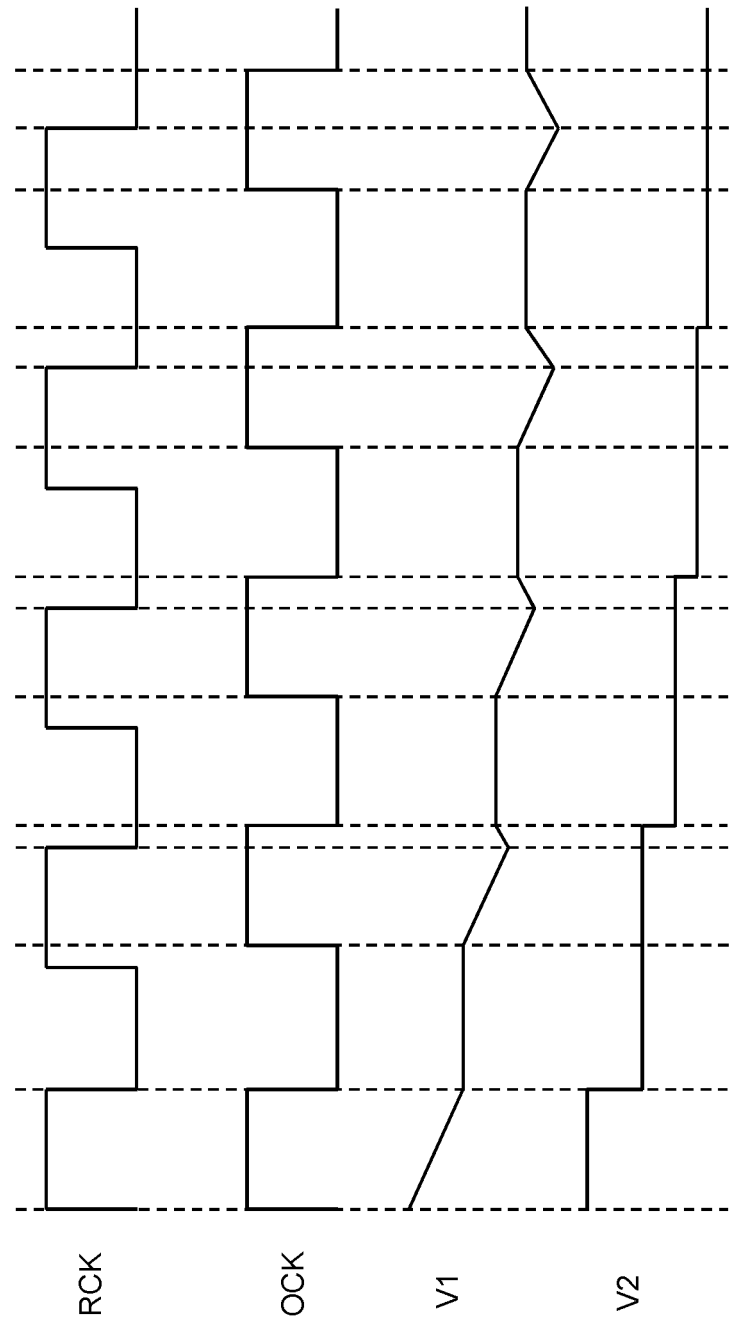
FIG. 4 represents a first timing diagram that illustrates an operation of the phase shifted clock generator in accordance with an embodiment of the present disclosure.

FIG. 4 represents a first timing diagram 400 that illustrates an operation of the phase shifted clock generator 104 in accordance with an embodiment of the present disclosure. The first timing diagram 400 illustrates the operation of the phase shifted clock generator 104 of FIGS. 2 and 3. After the initialization of the phase shifted clock generator 104, the output clock signal OCK may be in phase with the reference clock signal RCK. Further, the magnitudes of the first and second control voltages V1 and V2 may be equal.

During a first cycle of the reference clock signal RCK, when both the output and reference clock signals OCK and RCK are at the logic high state, the first capacitor 208 is discharged. The first control voltage V1 thus reduces. However, the switch 210 is deactivated and the second control voltage V2 is retained. Further, when the output clock signal OCK transitions to the logic low state, the switch 210 is activated and the magnitude of the second control voltage V2 is adjusted to be equal to the magnitude of the first control voltage V1. The reduction in the magnitude of the second control voltage V2 results in a reduction in the drive strengths of the plurality of transistors 220-226, thereby increasing the delay of the delay circuit 202.

During a second cycle of the reference clock signal RCK, the output and reference clock signals OCK and RCK are not in phase. Hence, the logic high state of the output clock signal OCK may coincide with both the logic states of the reference clock signal RCK. Consequently, the first capacitor 208 may be discharged and charged based on the logic high and low states of the reference clock signal RCK, respectively. Overall, the first control voltage V1 may still reduce, and based on the transition of the output clock signal OCK to the logic low state, the reduction in the first control voltage V1 is reflected in the second control voltage V2. Thus, the delay of the delay circuit 202 may further increase. The aforementioned operations may continue during third and fourth cycles of the reference clock signal RCK, with the first control voltage V1 reducing and the delay of the delay circuit 202 increasing in each cycle.

During a fifth cycle of the reference clock signal RCK, the phase difference between the output and reference clock signals OCK and RCK may be such that the first capacitor 208 may be discharged for half of the logic high state of the output clock signal OCK and charged for the other half. Further, the charging and discharging currents are equal. Hence, a change in the first control voltage V1 during the charging of the first capacitor 208 is equal to and inverse of a change in the first control voltage V1 during the discharging of the first capacitor 208. In other words, the value by which the first control voltage V1 increases during the charging of the first capacitor 208 is equal to the value by which the first control voltage V1 decreases during the discharging of the first capacitor 208. As a result, the first control voltage V1 at the falling edge of the output clock signal OCK may remain the same as that at the previous rising edge. Thus, the second control voltage V2 may remain unchanged. Such a state of the phase shifted clock generator 104 corresponds to the steady state. In such a scenario, the phase difference between the output and reference clock signals OCK and RCK may be within the predefined range (e.g., 90°).

The delay of the delay circuit 202 is thus controlled based on the second control voltage V2 (and in turn, the first control voltage V1) such that the phase difference between the output and reference clock signals OCK and RCK is within the predefined range.

Figure 5:
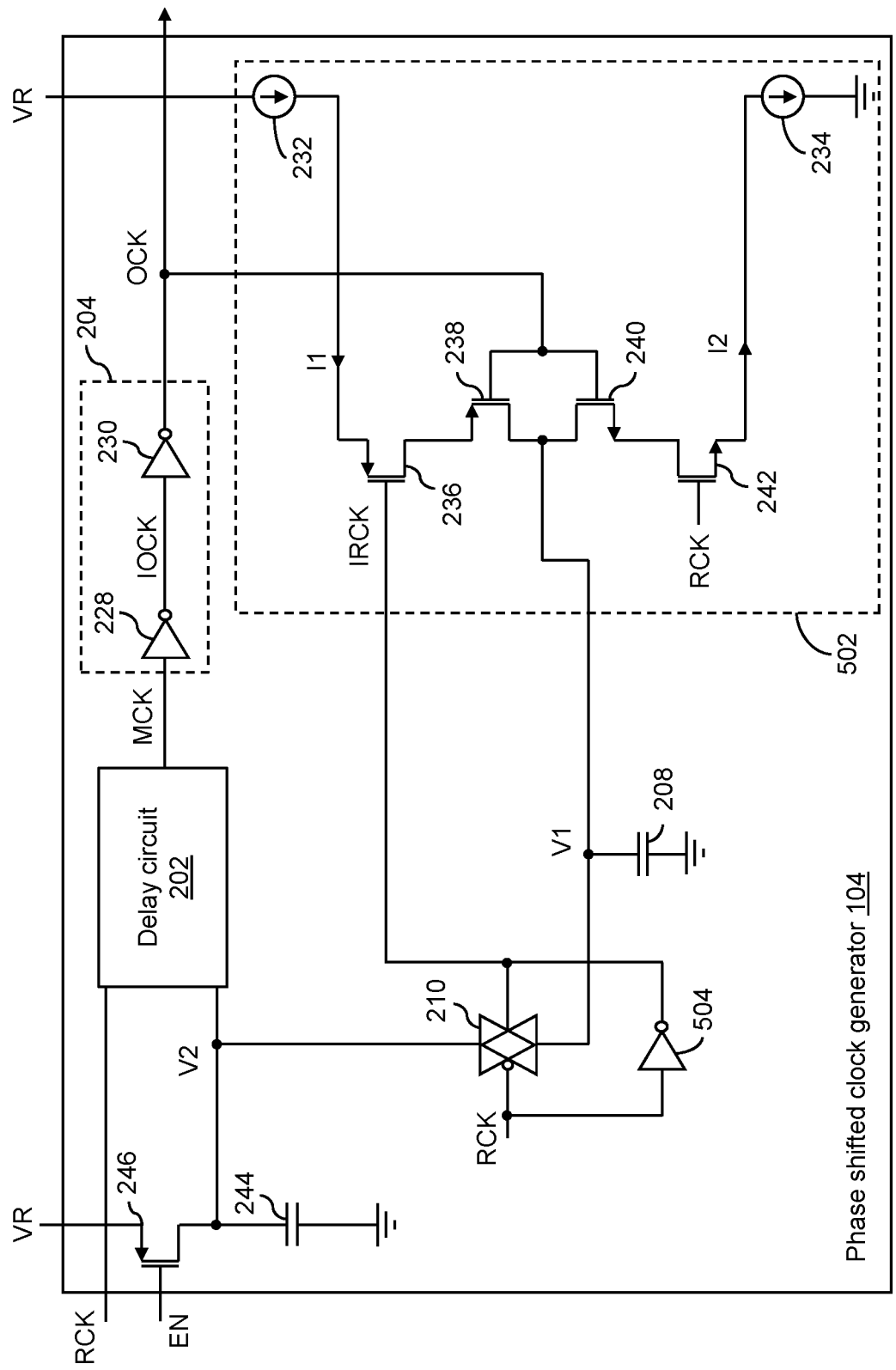
FIG. 5 illustrates a schematic circuit diagram of the phase shifted clock generator in accordance with yet another embodiment of the present disclosure.

FIG. 5 illustrates a schematic circuit diagram of the phase shifted clock generator 104 in accordance with yet another embodiment of the present disclosure. As illustrated in FIG. 5, the phase shifted clock generator 104 may include the delay circuit 202, the pair of series-coupled inverters 204, a third control circuit 502, the first and second capacitors 208 and 244, the switch 210, and the ninth transistor 246.

The structure and functionalities of the delay circuit 202, the pair of series-coupled inverters 204, the first and second capacitors 208 and 244, and the ninth transistor 246 remain same as described in FIG. 2. The difference between the phase shifted clock generator 104 of FIGS. 2 and 5 is that the first control circuit 206 is replaced with the third control circuit 502 in the phase shifted clock generator 104 of FIG. 5. The third control circuit 502 may include the same components as that included in the first control circuit 206. Thus, the third control circuit 502 may include the first current source 232, the first current sink 234, and the fifth through eighth transistors 236-242. The difference between the third control circuit 502 and the first control circuit 206 is in the control of the fifth through eighth transistors 236-242 (e.g., signals received at the gate terminals of the fifth through eighth transistors 236-242). As illustrated in FIG. 5, the gate terminal of the fifth transistor 236 may be configured to receive an inverted reference clock signal IRCK that is an inverted version of the reference clock signal RCK. The phase shifted clock generator 104 of FIG. 5 may further include a seventh inverter 504. The seventh inverter 504 may include an input terminal coupled to the oscillator 102, and configured to receive the reference clock signal RCK and an output terminal coupled to the gate terminal of the fifth transistor 236, and configured to generate and provide the inverted reference clock signal IRCK thereto. In other words, the fifth transistor 236 may be controlled based on the inverted reference clock signal IRCK. Further, the gate terminal of the eighth transistor 242 may be coupled to the oscillator 102, and configured to receive the reference clock signal RCK. In other words, the eighth transistor 242 may be controlled based on the reference clock signal RCK. The gate terminal of each of the sixth and seventh transistors 238 and 240 may be coupled to the output terminal of the sixth inverter 230, and configured to receive the output clock signal OCK. In other words, each of the sixth and seventh transistors 238 and 240 may be controlled based on the output clock signal OCK.

Based on the logic high state of each of the output and reference clock signals OCK and RCK, the fifth, seventh, and eighth transistors 236, 240, and 242 may be activated, the sixth transistor 238 may be deactivated, and the first capacitor 208 may be discharged by way of the first current sink 234. Further, based on the logic high state of the reference clock signal RCK and the logic low state of the output clock signal OCK, the fifth, sixth, and eighth transistors 236, 238, and 242 may be activated, the seventh transistor 240 may be deactivated, and the first capacitor 208 may be charged by way of the first current source 232. Thus, based on the logic high state of the reference clock signal RCK, the third control circuit 502 controls the first control voltage V1 by charging and discharging the first capacitor 208. The first capacitor 208 is charged and discharged based on the logic low and high states of the output clock signal OCK, respectively. Additionally, based on the logic low state of the reference clock signal RCK, the fifth and eighth transistors 236 and 242 may be deactivated, and the first capacitor 208 retains the associated charge.

Another difference between the phase shifted clock generator 104 of FIGS. 2 and 5 is in the control of the switch 210. For example, in the phase shifted clock generator 104 of FIG. 2, the switch 210 is activated and deactivated based on the logic low and high states of the output clock signal OCK, respectively, whereas, in the phase shifted clock generator 104 of FIG. 5, the switch 210 is activated and deactivated based on the logic low and high states of the reference clock signal RCK, respectively. The switch 210 is thus controlled based on the reference clock signal RCK. The positive and negative control terminals of the switch 210 may be coupled to the output terminal of the seventh inverter 504 and the oscillator 102, and configured to receive the inverted reference clock signal IRCK and the reference clock signal RCK, respectively. Based on the logic high state of the reference clock signal RCK, the third control circuit 502 may control the first control voltage V1. In such a scenario, the switch 210 is deactivated to ensure that the changes in the first control voltage V1 do not affect the second control voltage V2 (e.g., the second control voltage V2 is retained). Further, based on the transition of the reference clock signal RCK to the logic low state, the switch 210 is activated and the second control voltage V2 may be adjusted to be at the same magnitude as the first control voltage V1.

Figure 6:
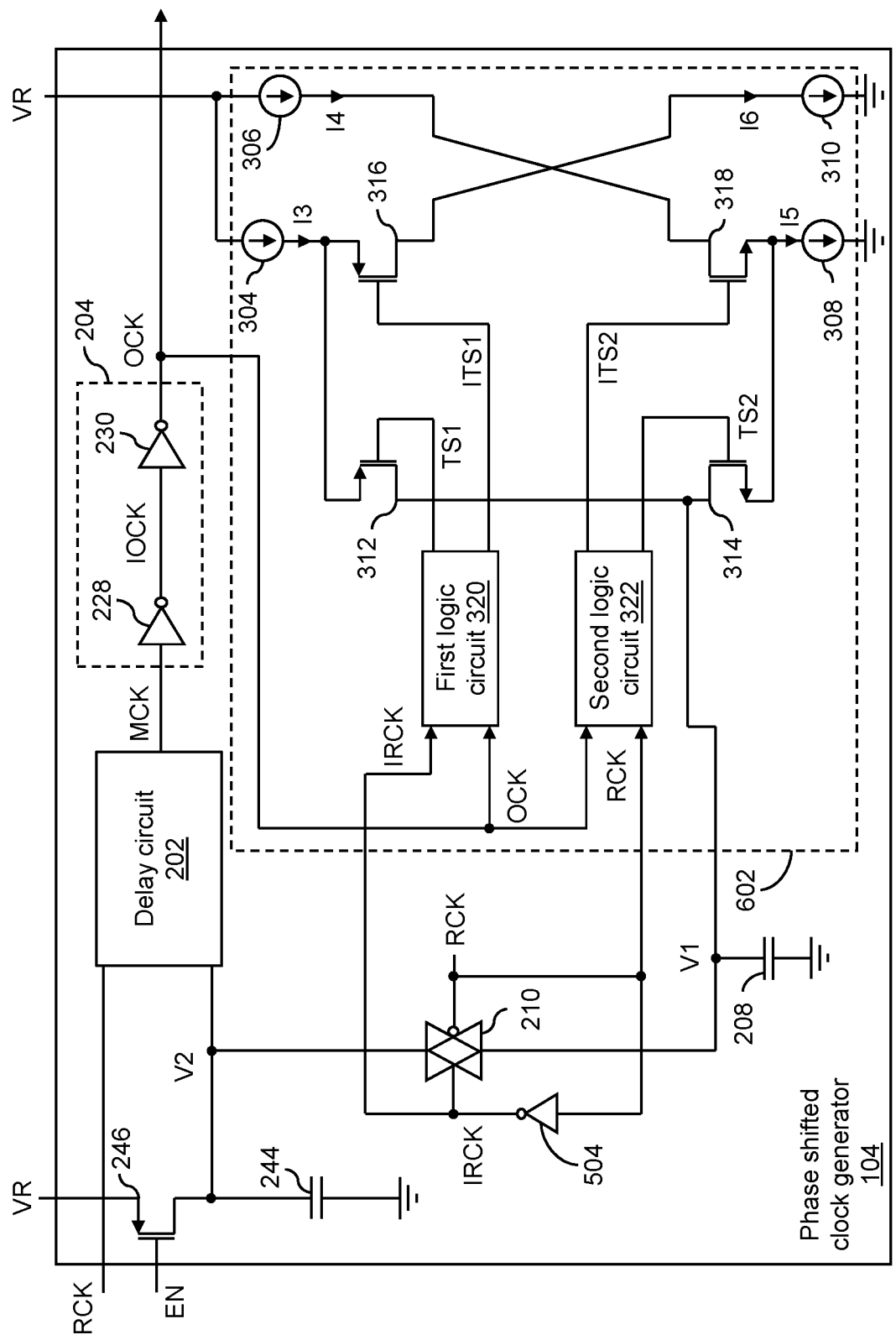
FIG. 6 illustrates a schematic circuit diagram of the phase shifted clock generator in accordance with yet another embodiment of the present disclosure.

FIG. 6 illustrates a schematic circuit diagram of the phase shifted clock generator 104 in accordance with yet another embodiment of the present disclosure. As illustrated in FIG. 6, the phase shifted clock generator 104 may include the delay circuit 202, the pair of series-coupled inverters 204, a fourth control circuit 602, the first and second capacitors 208 and 244, the switch 210, the ninth transistor 246, and the seventh inverter 504.

The structure and functionalities of the delay circuit 202, the pair of series-coupled inverters 204, the first and second capacitors 208 and 244, the switch 210, the ninth transistor 246, and the seventh inverter 504 remain same as described in FIG. 5. The difference between the phase shifted clock generator 104 of FIGS. 5 and 6 is that the third control circuit 502 is replaced with the fourth control circuit 602 in the phase shifted clock generator 104 of FIG. 6. The fourth control circuit 602 may have the same functionality but a different structure as compared to the third control circuit 502. Further, the fourth control circuit 602 may include the same components as that included in the second control circuit 302. Thus, the fourth control circuit 602 may include the second and third current sources 304 and 306, the second and third current sinks 308 and 310, tenth through thirteenth transistors 312-318, and the first and second logic circuits 320 and 322.

The difference between the fourth control circuit 602 and the second control circuit 302 is in the inputs of the first and second logic circuits 320 and 322. As illustrated in FIG. 6, the first logic circuit 320 may be coupled to the output terminals of the sixth and seventh inverters 230 and 504, and configured to receive the output clock signal OCK and the inverted reference clock signal IRCK, respectively. The first logic circuit 320 may thus generate the first trigger signal TS1 and the inverted first trigger signal ITS1 based on the output clock signal OCK and the inverted reference clock signal IRCK. The first trigger signal TS1 may be at the logic low state based on the logic low and high states of the output and reference clock signals OCK and RCK, respectively. Conversely, the first trigger signal TS1 may be at the logic high state based on the logic high state of the output clock signal OCK and/or the logic low state of the reference clock signal RCK. Similarly, the second logic circuit 322 may be coupled to the output terminal of the sixth inverter 230 and the oscillator 102, and configured to receive the output and reference clock signals OCK and RCK, respectively. The second logic circuit 322 may thus generate the second trigger signal TS2 and the inverted second trigger signal ITS2 based on the output and reference clock signals OCK and RCK. The second trigger signal TS2 may be at the logic high state based on the logic high state of each of the output and reference clock signals OCK and RCK. Conversely, the second trigger signal TS2 may be at the logic low state based on the logic low state of at least one of the output and reference clock signals OCK and RCK.

Thus, based on the logic high state of each of the output and reference clock signals OCK and RCK, the first and second trigger signals TS1 and TS2 may be at the logic high state. Thus, the eleventh and twelfth transistors 314 and 316 may be activated and the tenth and thirteenth transistors 312 and 318 may be deactivated. As a result, the first capacitor 208 may be discharged by way of the second current sink 308, and the flow of the third current I3 is continued by way of the twelfth transistor 316 and the third current sink 310. Further, based on the logic high state of the reference clock signal RCK and the logic low state of the output clock signal OCK, the first and second trigger signals TS1 and TS2 may be at the logic low state. Thus, the eleventh and twelfth transistors 314 and 316 may be deactivated and the tenth and thirteenth transistors 312 and 318 may be activated. As a result, the first capacitor 208 may be charged by way of the second current source 304, and the flow of the fifth current I5 may be continued by way of the thirteenth transistor 318 and the third current source 306. In other words, based on the logic high state of the reference clock signal RCK, the fourth control circuit 602 controls the first control voltage V1 such that the first capacitor 208 is charged and discharged based on the logic low and high states of the output clock signal OCK, respectively. Based on the logic low state of the reference clock signal RCK, the first and second trigger signals TS1 and TS2 may be at the logic high and low states, respectively. Thus, the tenth and eleventh transistors 312 and 314 may be deactivated, and the first capacitor 208 retains the associated charge. Further, the twelfth and thirteenth transistors 316 and 318 may be activated, and hence, the flow of the third and fifth currents I3 and I5 may be continued.

Both the third and fourth control circuits 502 and 602 control the first control voltage V1 based on the logic high state of the reference clock signal RCK, and based on the logic low state of the reference clock signal RCK, the first control voltage V1 may be retained. The functionality of the phase shifted clock generator 104 of FIGS. 5 and 6 remains same and is explained in conjunction with FIG. 7.

Figure 7:
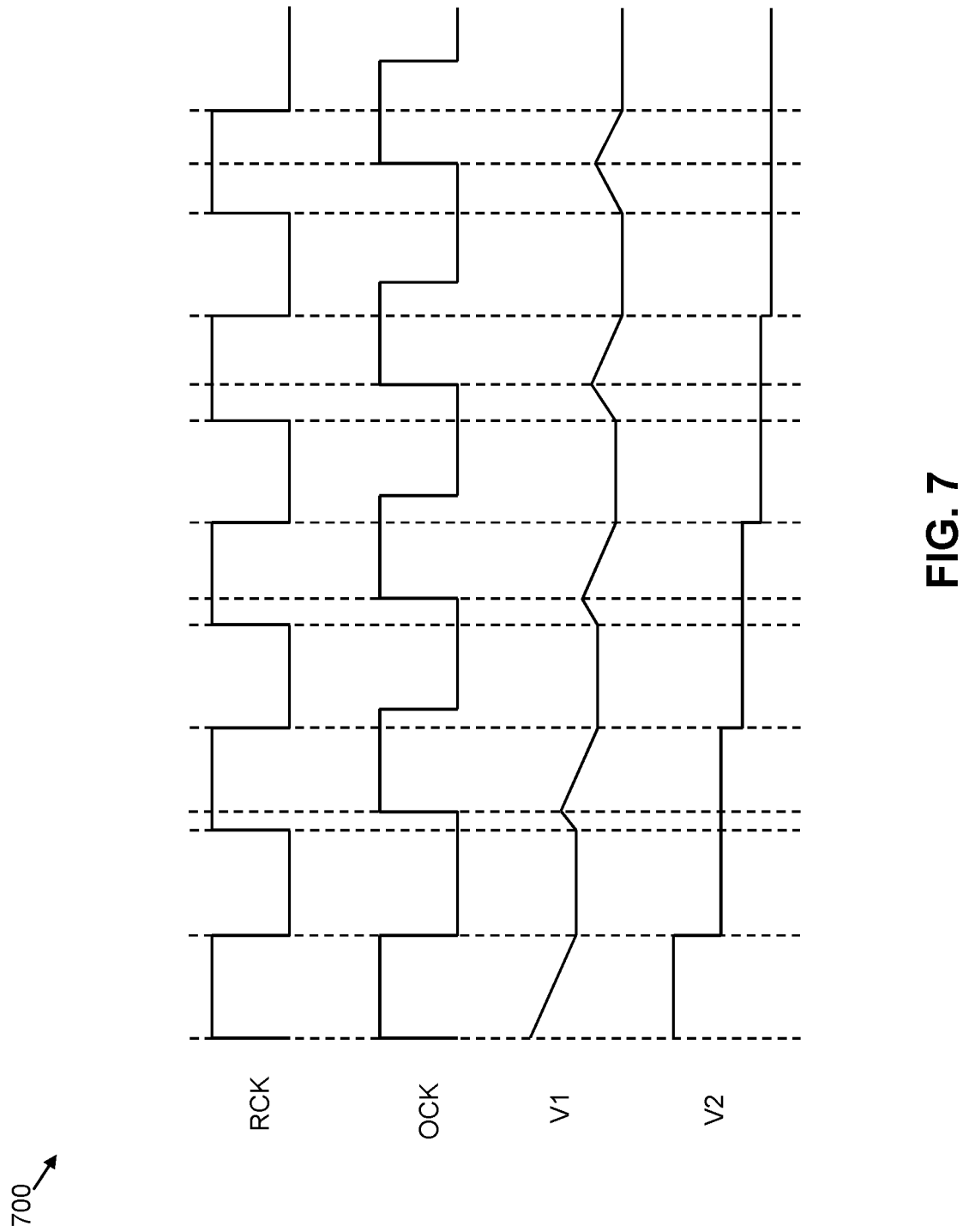
FIG. 7 represents a second timing diagram that illustrates the operation of the phase shifted clock generator in accordance with another embodiment of the present disclosure.

FIG. 7 represents a second timing diagram 700 that illustrates the operation of the phase shifted clock generator 104 in accordance with an embodiment of the present disclosure. The second timing diagram 700 illustrates the operation of the phase shifted clock generator 104 of FIGS. 5 and 6.

During a first cycle of the reference clock signal RCK, the output and reference clock signals OCK and RCK are in phase. Thus, when both the output and reference clock signals OCK and RCK are at the logic high state, the first capacitor 208 is discharged and the first control voltage V1 reduces. However, the switch 210 is deactivated and the second control voltage V2 is retained. When the reference clock signal RCK transitions to the logic low state, the switch 210 is activated and the magnitude of the second control voltage V2 is adjusted to be equal to that of the first control voltage V1, thereby increasing the delay of the delay circuit 202.

During a second cycle of the reference clock signal RCK, the output and reference clock signals OCK and RCK are not in phase. Hence, the logic high state of the reference clock signal RCK may coincide with both logic states of the output clock signal OCK. Consequently, the first capacitor 208 may be charged and discharged when the output clock signal OCK is at the logic low and high states, respectively. Overall, the first control voltage V1 may still reduce, and when the reference clock signal RCK transitions to the logic low state, the reduction in the first control voltage V1 is reflected in the second control voltage V2, thereby further increasing the delay of the delay circuit 202. The aforementioned operations may continue during third and fourth cycles of the reference clock signal RCK, with the first control voltage V1 reducing and the delay increasing in each cycle. During a fifth cycle of the reference clock signal RCK, the phase difference between the output and reference clock signals OCK and RCK may be such that the first capacitor 208 may be charged for half of the logic high state of the reference clock signal RCK and discharged for the other half. As the charging and discharging currents are same, the second control voltage V2 may remain unchanged. The delay of the delay circuit 202 is thus controlled based on the second control voltage V2 (and in turn, the first control voltage V1) such that the phase difference between the output and reference clock signals OCK and RCK is within the predefined range.

Figure 8:
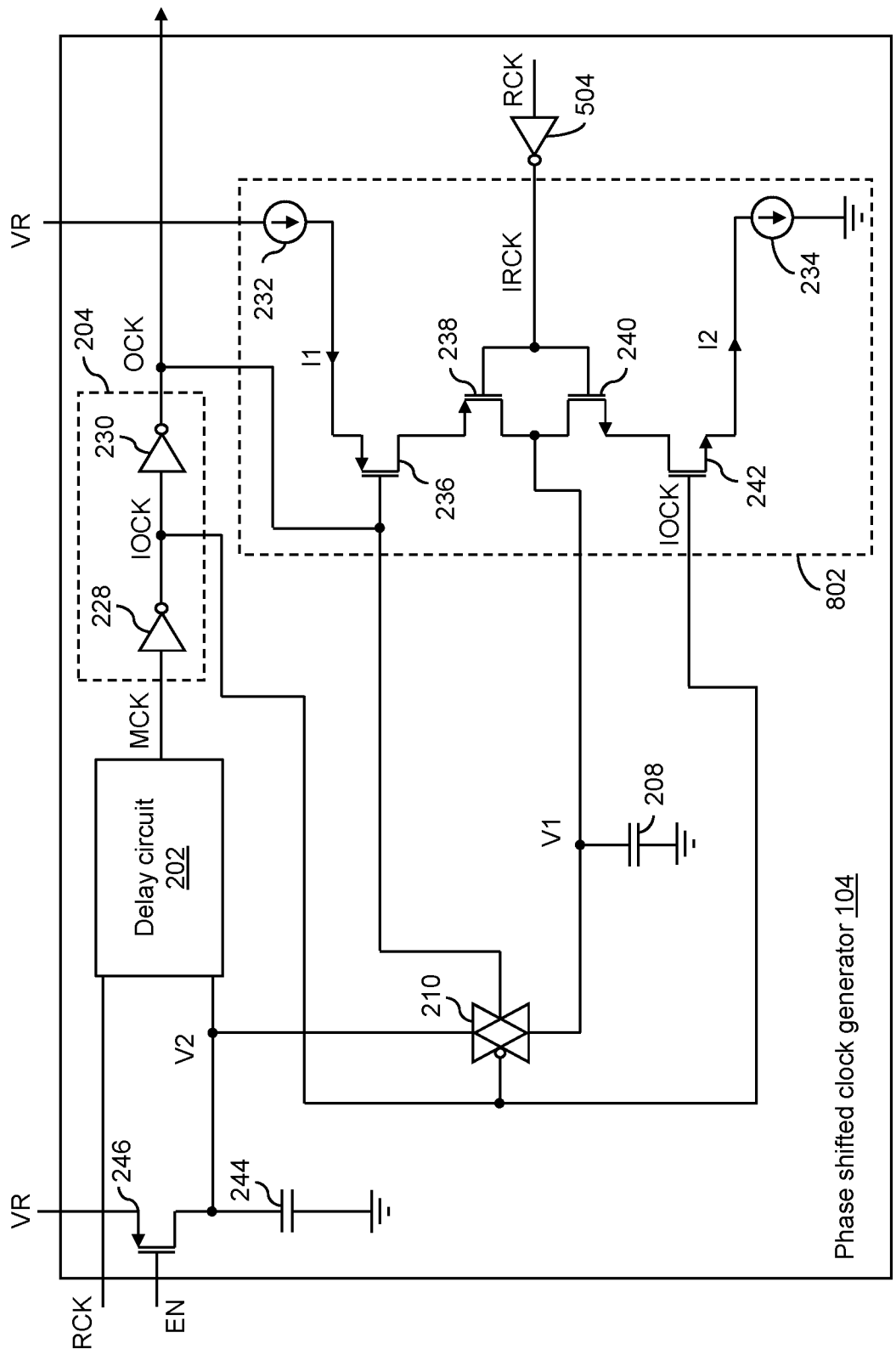
FIG. 8 illustrates a schematic circuit diagram of the phase shifted clock generator in accordance with yet another embodiment of the present disclosure.

FIG. 8 illustrates a schematic circuit diagram of the phase shifted clock generator 104 in accordance with yet another embodiment of the present disclosure. As illustrated in FIG. 8, the phase shifted clock generator 104 may include the delay circuit 202, the pair of series-coupled inverters 204, a fifth control circuit 802, the first and second capacitors 208 and 244, the switch 210, the ninth transistor 246, and the seventh inverter 504.

The structure and functionalities of the delay circuit 202, the pair of series-coupled inverters 204, the first and second capacitors 208 and 244, and the ninth transistor 246 remain same as described in FIG. 2, and that of the seventh inverter 504 remain same as described in FIG. 5. The difference between the phase shifted clock generator 104 of FIGS. 2 and 8 is that the first control circuit 206 is replaced with the fifth control circuit 802 in the phase shifted clock generator 104 of FIG. 8. The fifth control circuit 802 may include the same components as that included in the first control circuit 206. Thus, the fifth control circuit 802 may include the first current source 232, the first current sink 234, and the fifth through eighth transistors 236-242. The difference between the fifth control circuit 802 and the first control circuit 206 is in the control of the fifth through eighth transistors 236-242 (e.g., signals received at the gate terminals of the fifth through eighth transistors 236-242).

As illustrated in FIG. 8, the gate terminals of the fifth and eighth transistors 236 and 242 may be coupled to the output terminals of the sixth and fifth inverters 230 and 228, and configured to receive the output clock signal OCK and the inverted output clock signal IOCK, respectively. In other words, the fifth and eighth transistors 236 and 242 may be controlled based on the output clock signal OCK and the inverted output clock signal IOCK, respectively. The gate terminal of each of the sixth and seventh transistors 238 and 240 may be coupled to the output terminal of the seventh inverter 504, and configured to receive the inverted reference clock signal IRCK. In other words, each of the sixth and seventh transistors 238 and 240 may be controlled based on the inverted reference clock signal IRCK. Based on the logic low state of each of the output and reference clock signals OCK and RCK, the fifth, seventh, and eighth transistors 236, 240, and 242 may be activated, the sixth transistor 238 may be deactivated, and the first capacitor 208 may be discharged by way of the first current sink 234. Further, based on the logic low state of the output clock signal OCK and the logic high state of the reference clock signal RCK, the fifth, sixth, and eighth transistors 236, 238, and 242 may be activated, the seventh transistor 240 may be deactivated, and the first capacitor 208 may be charged by way of the first current source 232. Thus, based on the logic low state of the output clock signal OCK, the fifth control circuit 802 controls the first control voltage V1 such that the first capacitor 208 is discharged and charged based on the logic low and high states of the reference clock signal RCK, respectively. Additionally, based on the logic high state of the output clock signal OCK, the fifth and eighth transistors 236 and 242 may be deactivated, and the first capacitor 208 retains the associated charge.

Another difference between the phase shifted clock generator 104 of FIGS. 2 and 8 is in the control of the switch 210. For example, in the phase shifted clock generator 104 of FIG. 2, the switch 210 is activated and deactivated based on the logic low and high states of the output clock signal OCK, respectively, whereas, in the phase shifted clock generator 104 of FIG. 8, the switch 210 is activated and deactivated based on the logic high and low states of the output clock signal OCK, respectively. Thus, the positive and negative control terminals of the switch 210 may be coupled to the output terminals of the sixth and fifth inverters 230 and 228, and configured to receive the output clock signal OCK and the inverted output clock signal IOCK, respectively. Based on the logic low state of the output clock signal OCK, the fifth control circuit 802 may control the first control voltage V1. In such a scenario, the switch 210 is deactivated to ensure that the changes in the first control voltage V1 do not affect the second control voltage V2 (e.g., the second control voltage V2 is retained). Further, based on the transition of the output clock signal OCK to the logic high state, the switch 210 is activated and the second control voltage V2 may be adjusted to be at the same magnitude as the first control voltage V1.

Figure 9:
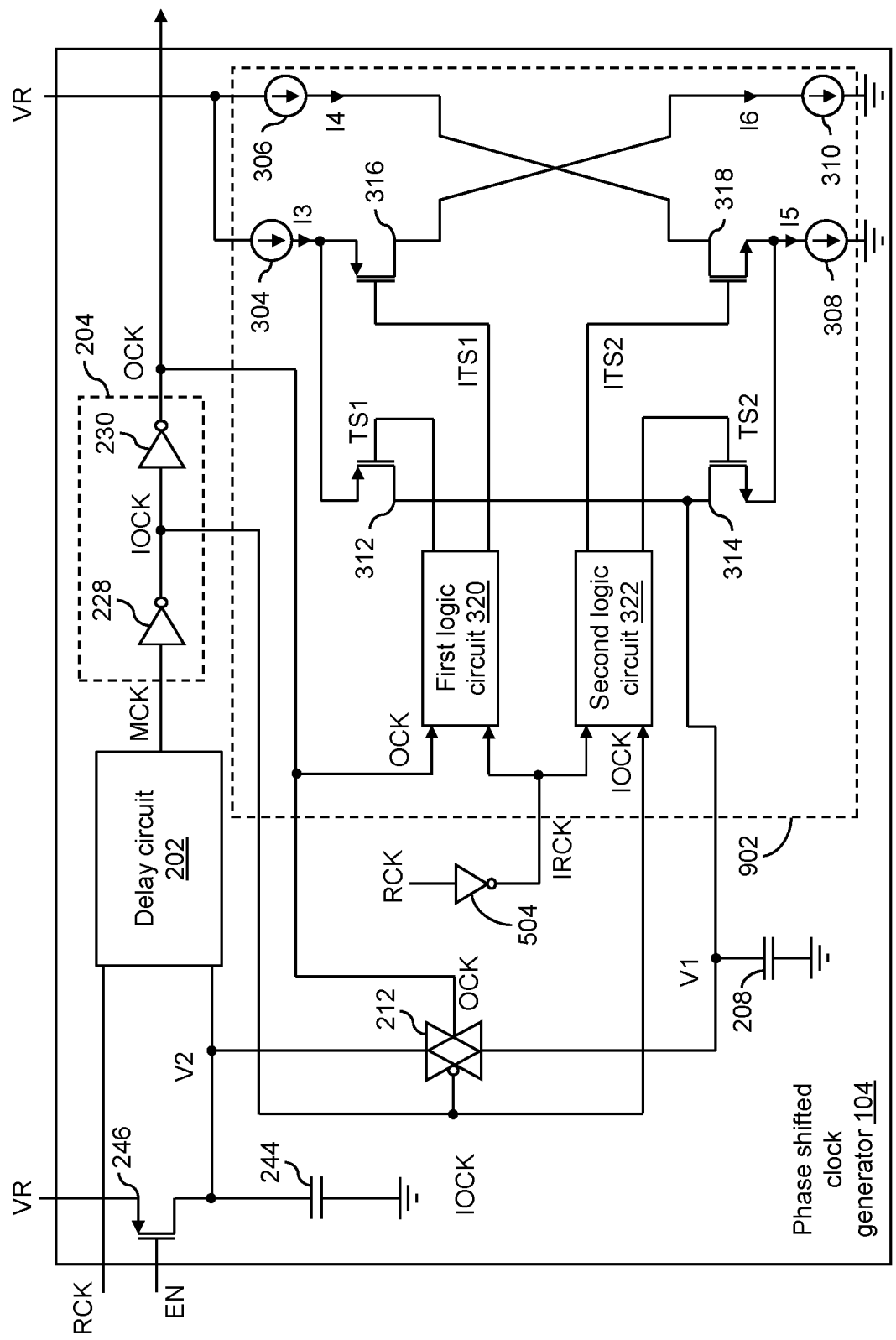
FIG. 9 illustrates a schematic circuit diagram of the phase shifted clock generator in accordance with yet another embodiment of the present disclosure.

FIG. 9 illustrates a schematic circuit diagram of the phase shifted clock generator 104 in accordance with yet another embodiment of the present disclosure. As illustrated in FIG. 9, the phase shifted clock generator 104 may include the delay circuit 202, the pair of series-coupled inverters 204, a sixth control circuit 902, the first and second capacitors 208 and 244, the switch 210, the ninth transistor 246, and the seventh inverter 504.

The structure and functionalities of the delay circuit 202, the pair of series-coupled inverters 204, the first and second capacitors 208 and 244, the switch 210, the ninth transistor 246, and the seventh inverter 504 remain same as described in FIG. 8. The difference between the phase shifted clock generator 104 of FIGS. 8 and 9 is that the fifth control circuit 802 is replaced with the sixth control circuit 902 in the phase shifted clock generator 104 of FIG. 9. The sixth control circuit 902 may have the same functionality but different structure as compared to the fifth control circuit 802. Further, the sixth control circuit 902 may include the same components as that included in the second control circuit 302. Thus, the sixth control circuit 902 may include the second and third current sources 304 and 306, the second and third current sinks 308 and 310, the tenth through thirteenth transistors 312-318, and the first and second logic circuits 320 and 322. The difference between the sixth control circuit 902 and the second control circuit 302 is in the inputs of the first and second logic circuits 320 and 322.

As illustrated in FIG. 9, the first logic circuit 320 may be coupled to the output terminals of the sixth and seventh inverters 230 and 504, and configured to receive the output clock signal OCK and the inverted reference clock signal IRCK, respectively. The first logic circuit 320 may thus generate the first trigger signal TS1 and the inverted first trigger signal ITS1 based on the output clock signal OCK and the inverted reference clock signal IRCK. The first trigger signal TS1 may be at the logic low state based on the logic low and high states of the output and reference clock signals OCK and RCK, respectively. Conversely, the first trigger signal TS1 may be at the logic high state based on the logic low state of the reference clock signal RCK and/or the logic high state of the output clock signal OCK. Similarly, the second logic circuit 322 may be coupled to the output terminals of the fifth and seventh inverters 228 and 504, and configured to receive the inverted output clock signal IOCK and the inverted reference clock signal IRCK, respectively. The second logic circuit 322 may thus generate the second trigger signal TS2 and the inverted second trigger signal ITS2 based on the inverted output clock signal IOCK and the inverted reference clock signal IRCK. The second trigger signal TS2 may be at the logic high state based on the logic low state of each of the output and reference clock signals OCK and RCK. Conversely, the second trigger signal TS2 may be at the logic low state based on the logic high state of at least one of the output and reference clock signals OCK and RCK.

Thus, based on the logic low state of each of the output and reference clock signals OCK and RCK, the first and second trigger signals TS1 and TS2 may be at the logic high state. Thus, the eleventh and twelfth transistors 314 and 316 may be activated and the tenth and thirteenth transistors 312 and 318 may be deactivated. As a result, the first capacitor 208 may be discharged by way of the second current sink 308, and the flow of the third current I3 is continued by way of the twelfth transistor 316 and the third current sink 310. Further, based on the logic low state of the output clock signal OCK and the logic high state of the reference clock signal RCK, the first and second trigger signals TS1 and TS2 may be at the logic low state. Thus, the eleventh and twelfth transistors 314 and 316 may be deactivated and the tenth and thirteenth transistors 312 and 318 may be activated. As a result, the first capacitor 208 may be charged by way of the second current source 304, and the flow of the fifth current I5 may be continued by way of the thirteenth transistor 318 and the third current source 306. Thus, based on the logic low state of the output clock signal OCK, the sixth control circuit 902 controls the first control voltage V1 such that the first capacitor 208 is discharged and charged based on the logic low and high states of the reference clock signal RCK, respectively. Based on the logic high state of the output clock signal OCK, the first and second trigger signals TS1 and TS2 may be at the logic high and low states, respectively. Thus, the tenth and eleventh transistors 312 and 314 may be deactivated, and the first capacitor 208 retains the associated charge. Further, the twelfth and thirteenth transistors 316 and 318 may be activated. Hence, the flow of the third and fifth currents I3 and I5 may be continued.

Both the fifth and sixth control circuits 802 and 902 control the first control voltage V1 based on the logic low state of the output clock signal OCK, and based on the logic high state of the output clock signal OCK, the first control voltage V1 may be retained. The functionality of the phase shifted clock generator 104 of FIGS. 8 and 9 remains same and is explained in conjunction with FIG. 10.

Figure 10:
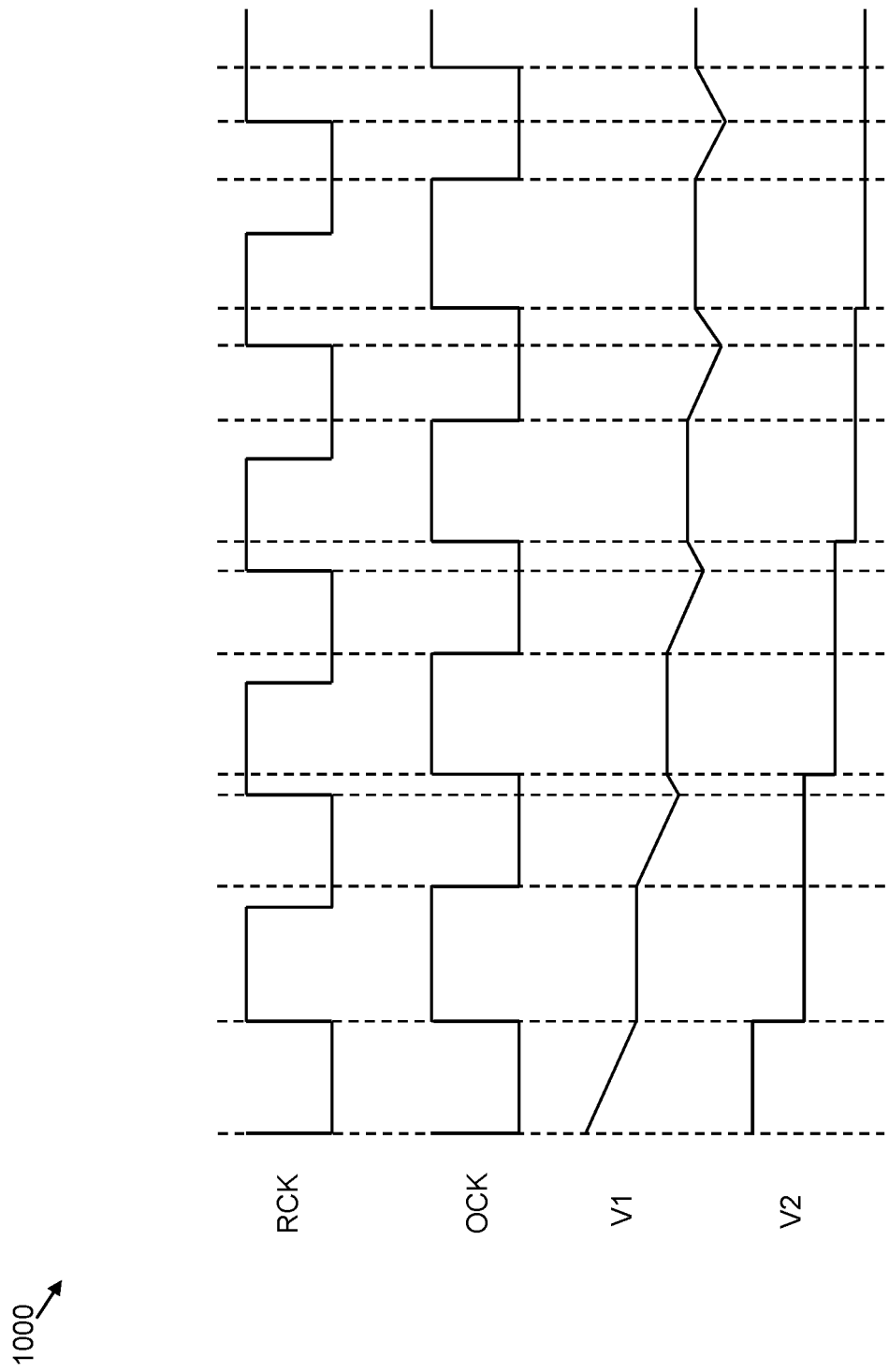
FIG. 10 represents a third timing diagram that illustrates the operation of the phase shifted clock generator in accordance with yet another embodiment of the present disclosure.

FIG. 10 represents a third timing diagram 1000 that illustrates the operation of the phase shifted clock generator 104 in accordance with an embodiment of the present disclosure. The third timing diagram 1000 illustrates the operation of the phase shifted clock generator 104 of FIGS. 8 and 9.

During a first cycle of the reference clock signal RCK, the output and reference clock signals OCK and RCK are in phase. In the third timing diagram 1000, a cycle starts from a negative half-cycle as opposed to the positive half-cycle in the first and second timing diagrams 400 and 700. When both the output and reference clock signals OCK and RCK are at the logic low state, the first capacitor 208 is discharged and the first control voltage V1 reduces. However, the switch 210 is deactivated and the second control voltage V2 is retained. When the output clock signal OCK transitions to the logic high state, the switch 210 is activated and the magnitude of the second control voltage V2 is adjusted to be equal to the magnitude of the first control voltage V1, thereby increasing the delay of the delay circuit 202.

During a second cycle of the reference clock signal RCK, the output and reference clock signals OCK and RCK are not in phase. Hence, the logic low state of the output clock signal OCK may coincide with both logic states of the reference clock signal RCK. Consequently, the first capacitor 208 may be discharged and charged when the reference clock signal RCK is at the logic low and high states, respectively. Overall, the first control voltage V1 may still reduce, and when the output clock signal OCK transitions to the logic high state, the reduction in the first control voltage V1 is reflected in the second control voltage V2, thereby further increasing the delay of the delay circuit 202. The aforementioned operations may continue during the third and fourth cycles of the reference clock signal RCK, with the first control voltage V1 reducing and the delay increasing in each cycle.

During a fifth cycle of the reference clock signal RCK, the phase difference between the output and reference clock signals OCK and RCK may be such that the first capacitor 208 may be discharged for half of the logic low state of the output clock signal OCK and charged for the other half. Further, as the charging and discharging currents are same, the second control voltage V2 may remain unchanged. The delay of the delay circuit 202 is thus controlled based on the second control voltage V2 (and in turn, the first control voltage V1) such that the phase difference between the output and reference clock signals OCK and RCK is within the predefined range.

Figure 11:
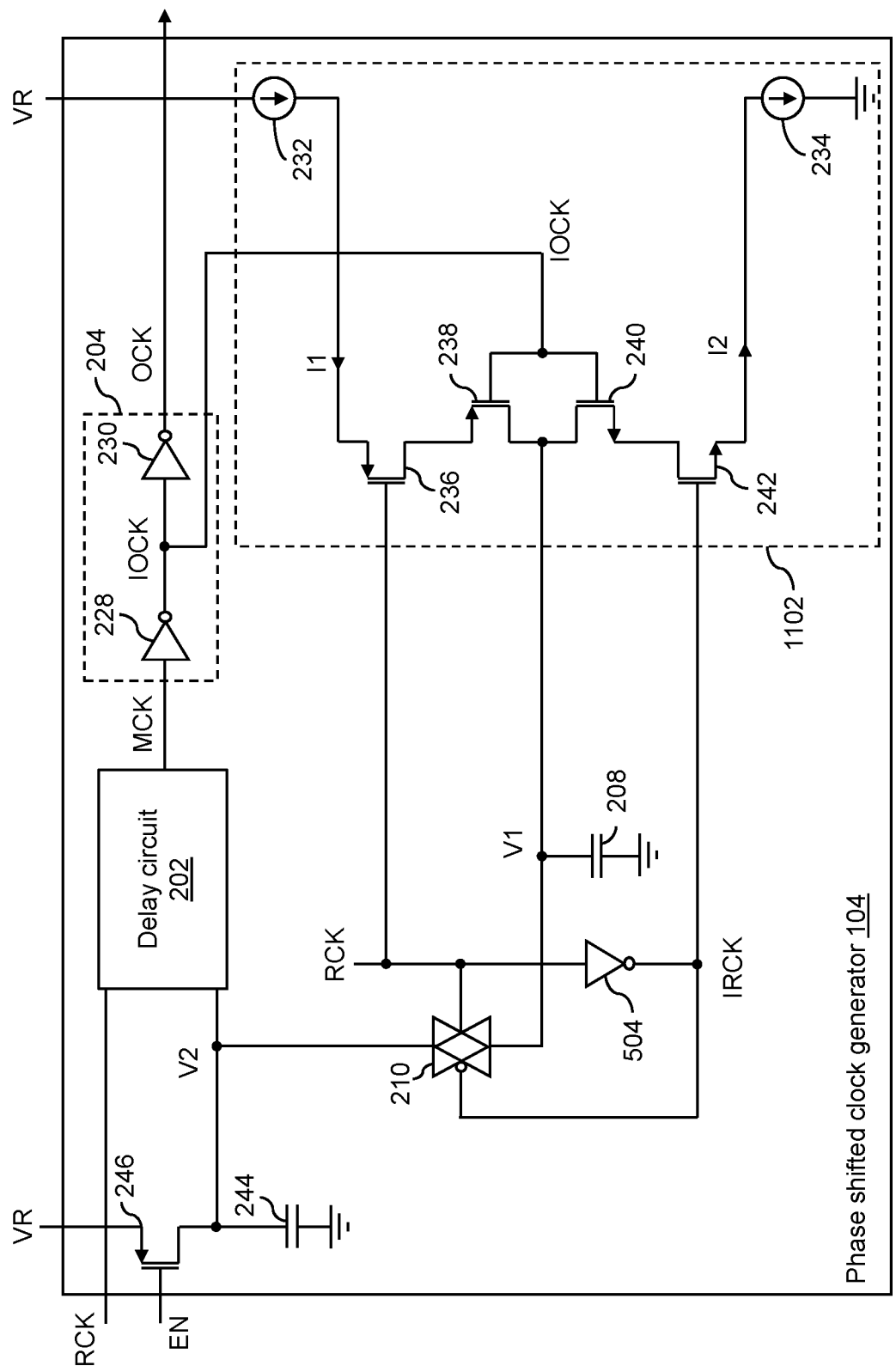
FIG. 11 illustrates a schematic circuit diagram of the phase shifted clock generator in accordance with yet another embodiment of the present disclosure.

FIG. 11 illustrates a schematic circuit diagram of the phase shifted clock generator 104 in accordance with yet another embodiment of the present disclosure. As illustrated in FIG. 11, the phase shifted clock generator 104 may include the delay circuit 202, the pair of series-coupled inverters 204, a seventh control circuit 1102, the first and second capacitors 208 and 244, the switch 210, the ninth transistor 246, and the seventh inverter 504.

The structure and functionalities of the delay circuit 202, the pair of series-coupled inverters 204, the first and second capacitors 208 and 244, and the ninth transistor 246 remain same as described in FIG. 2, and that of the seventh inverter 504 remain same as described in FIG. 5. The difference between the phase shifted clock generator 104 of FIGS. 2 and 11 is that the first control circuit 206 is replaced with the seventh control circuit 1102 in the phase shifted clock generator 104 of FIG. 11. The seventh control circuit 1102 may include the same components as that included in the first control circuit 206. Thus, the seventh control circuit 1102 may include the first current source 232, the first current sink 234, and the fifth through eighth transistors 236-242. The difference between the seventh control circuit 1102 and the first control circuit 206 is in the control of the fifth through eighth transistors 236-242 (e.g., signals received at the gate terminals of the fifth through eighth transistors 236-242). As illustrated in FIG. 11, the gate terminals of the fifth and eighth transistors 236 and 242 may be coupled to the oscillator 102 and the output terminal of the seventh inverter 504, and configured to receive the reference clock signal RCK and the inverted reference clock signal IRCK, respectively. In other words, the fifth and eighth transistors 236 and 242 may be controlled based on the reference clock signal RCK and the inverted reference clock signal IRCK, respectively. Further, the gate terminal of each of the sixth and seventh transistors 238 and 240 may be coupled to the output terminal of the fifth inverter 228, and configured to receive the inverted output clock signal IOCK. In other words, each of the sixth and seventh transistors 238 and 240 may be controlled based on the inverted output clock signal IOCK. Based on the logic low state of each of the output and reference clock signals OCK and RCK, the fifth, seventh, and eighth transistors 236, 240, and 242 may be activated, the sixth transistor 238 may be deactivated, and the first capacitor 208 may be discharged by way of the first current sink 234. Further, based on the logic low state of the reference clock signal RCK and the logic high state of the output clock signal OCK, the fifth, sixth, and eighth transistors 236, 238, and 242 may be activated, the seventh transistor 240 may be deactivated, and the first capacitor 208 may be charged by way of the first current source 232. Thus, based on the logic low state of the reference clock signal RCK, the seventh control circuit 1102 controls the first control voltage V1 such that the first capacitor 208 is charged and discharged based on the logic high and low states of the output clock signal OCK, respectively. Further, based on the logic high state of the reference clock signal RCK, the fifth and eighth transistors 236 and 242 may be deactivated, and the first capacitor 208 retains the associated charge. Another difference between the phase shifted clock generator 104 of FIGS. 2 and 11 is in the control of the switch 210. For example, in the phase shifted clock generator 104 of FIG. 2, the switch 210 is activated and deactivated based on the logic low and high states of the output clock signal OCK, respectively, whereas, in the phase shifted clock generator 104 of FIG. 11, the switch 210 is activated and deactivated based on the logic high and low states of the reference clock signal RCK, respectively. Thus, the positive and negative control terminals of the switch 210 may be coupled to the oscillator 102 and the output terminal of the seventh inverter 504, and configured to receive the reference clock signal RCK and the inverted reference clock signal IRCK, respectively. Based on the logic low state of the reference clock signal RCK, the seventh control circuit 1102 may control the first control voltage V1. In such a scenario, the switch 210 is deactivated to ensure that the changes in the first control voltage V1 do not affect the second control voltage V2. Further, based on the transition of the reference clock signal RCK to the logic high state, the switch 210 is activated and the second control voltage V2 may be adjusted to be at the same magnitude as the first control voltage V1.

Figure 12:
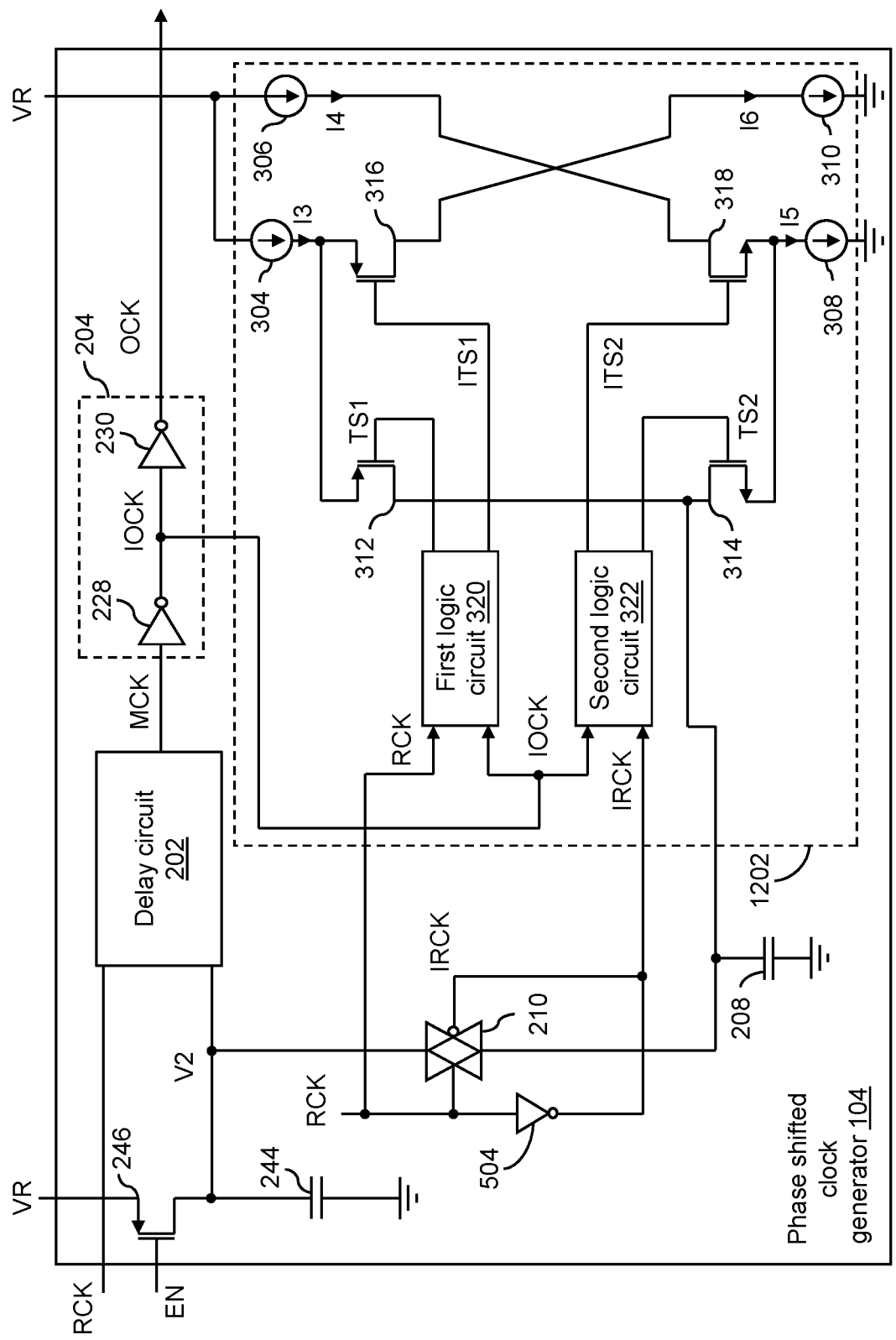
FIG. 12 illustrates a schematic circuit diagram of the phase shifted clock generator in accordance with yet another embodiment of the present disclosure.

FIG. 12 illustrates a schematic circuit diagram of the phase shifted clock generator 104 in accordance with yet another embodiment of the present disclosure. As illustrated in FIG. 12, the phase shifted clock generator 104 may include the delay circuit 202, the pair of series-coupled inverters 204, an eighth control circuit 1202, the first and second capacitors 208 and 244, the switch 210, the ninth transistor 246, and the seventh inverter 504.

The structure and functionalities of the delay circuit 202, the pair of series-coupled inverters 204, the first and second capacitors 208 and 244, the switch 210, the ninth transistor 246, and the seventh inverter 504 remain same as described in FIG. 11. The difference between the phase shifted clock generator 104 of FIGS. 11 and 12 is that the seventh control circuit 1102 is replaced with the eighth control circuit 1202 in the phase shifted clock generator 104 of FIG. 12. The eighth control circuit 1202 may have the same functionality but different structure as compared to the seventh control circuit 1102. Further, the eighth control circuit 1202 may include the same components as that included in the second control circuit 302. Thus, the eighth control circuit 1202 may include the second and third current sources 304 and 306, the second and third current sinks 308 and 310, the tenth through thirteenth transistors 312-318, and the first and second logic circuits 320 and 322. The difference between the eighth control circuit 1202 and the second control circuit 302 is in the inputs of the first and second logic circuits 320 and 322.

As illustrated in FIG. 12, the first logic circuit 320 may be coupled to the output terminal of the fifth inverter 228 and the oscillator 102, and configured to receive the inverted output clock signal IOCK and the reference clock signal RCK, respectively. The first logic circuit 320 may thus generate the first trigger signal TS1 and the inverted first trigger signal ITS1 based on the inverted output clock signal IOCK and the reference clock signal RCK. The first trigger signal TS1 may be at the logic low state based on the logic high and low states of the output and reference clock signals OCK and RCK, respectively. Conversely, the first trigger signal TS1 may be at the logic high state based on the logic high state of the reference clock signal RCK and/or the logic low state of the output clock signal OCK. Similarly, the second logic circuit 322 may be coupled to the output terminals of the fifth and seventh inverters 228 and 504, and configured to receive the inverted output clock signal IOCK and the inverted reference clock signal IRCK, respectively. The second logic circuit 322 may thus generate the second trigger signal TS2 and the inverted second trigger signal ITS2 based on the inverted output clock signal IOCK and the inverted reference clock signal IRCK. The second trigger signal TS2 may be at the logic high state based on the logic low state of each of the output and reference clock signals OCK and RCK. Conversely, the second trigger signal TS2 may be at the logic low state based on the logic high state of at least one of the output and reference clock signals OCK and RCK.

Thus, based on the logic low state of each of the output and reference clock signals OCK and RCK, the first and second trigger signals TS1 and TS2 may be at the logic high state. Hence, the eleventh and twelfth transistors 314 and 316 may be activated and the tenth and thirteenth transistors 312 and 318 may be deactivated. As a result, the first capacitor 208 may be discharged by way of the second current sink 308, and the flow of the third current I3 is continued by way of the twelfth transistor 316 and the third current sink 310. Further, based on the logic low state of the reference clock signal RCK and the logic high state of the output clock signal OCK, the first and second trigger signals TS1 and TS2 may be at the logic low state. Thus, the eleventh and twelfth transistors 314 and 316 may be deactivated and the tenth and thirteenth transistors 312 and 318 may be activated. As a result, the first capacitor 208 may be charged by way of the second current source 304, and the flow of the fifth current I5 may be continued by way of the thirteenth transistor 318 and the third current source 306. Thus, based on the logic low state of the reference clock signal RCK, the eighth control circuit 1202 controls the first control voltage V1 such that the first capacitor 208 is charged and discharged based on the logic high and low states of the output clock signal OCK, respectively. Based on the logic high state of the reference clock signal RCK, the first and second trigger signals TS1 and TS2 may be at the logic high and low states, respectively. Thus, the tenth and eleventh transistors 312 and 314 may be deactivated, and the first capacitor 208 retains the associated charge. Further, the twelfth and thirteenth transistors 316 and 318 may be activated. Hence, the flow of the third and fifth currents I3 and I5 may be continued.

Both the seventh and eighth control circuits 1102 and 1202 control the first control voltage V1 based on the logic low state of the reference clock signal RCK, and based on the logic high state of the reference clock signal RCK, the first control voltage V1 may be retained. The functionality of the phase shifted clock generator 104 of FIGS. 11 and 12 remains same and is explained in conjunction with FIG. 13.

Figure 13:
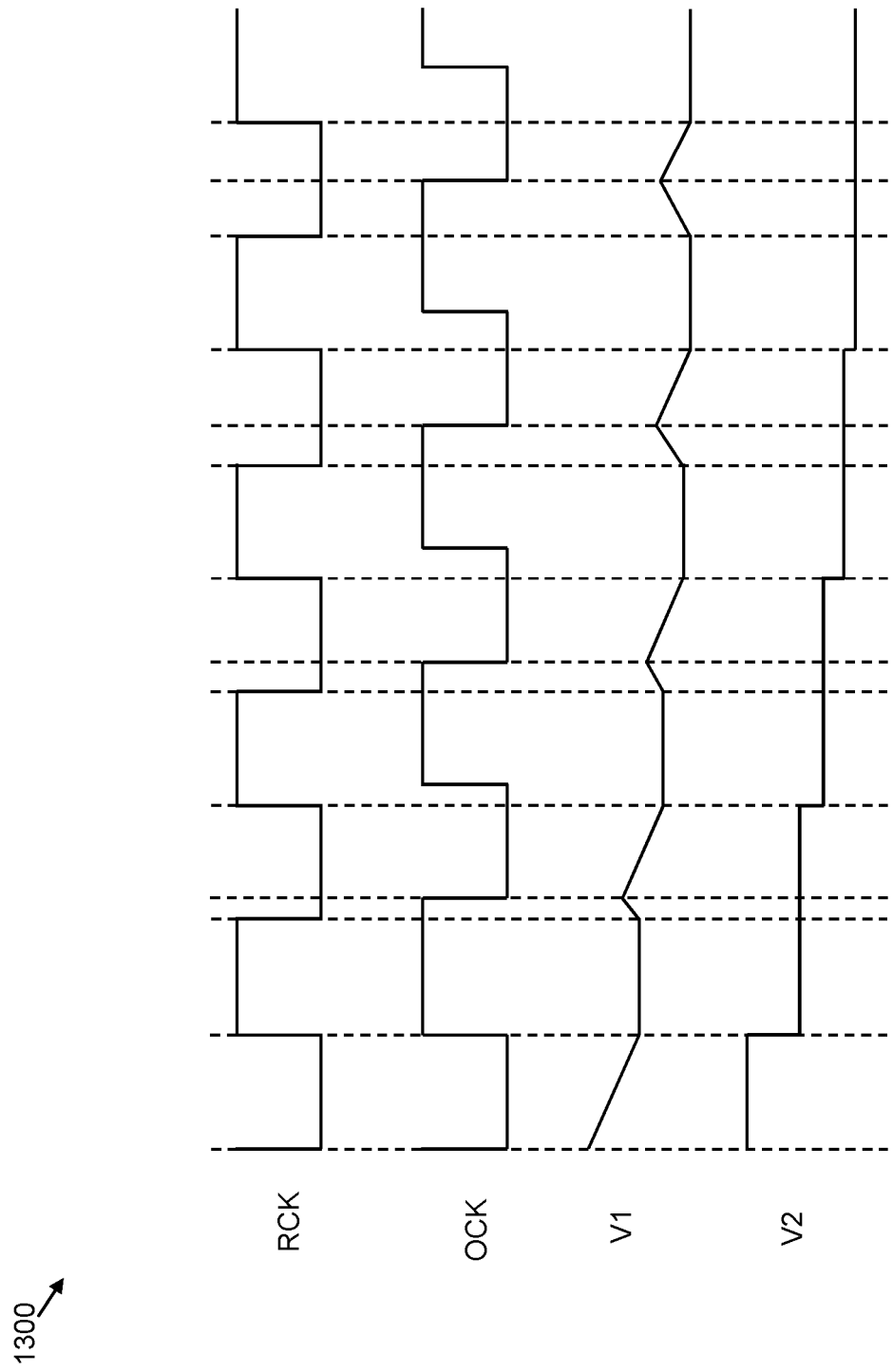
FIG. 13 represents a fourth timing diagram that illustrates the operation of the phase shifted clock generator in accordance with yet another embodiment of the present disclosure.

FIG. 13 represents a fourth timing diagram 1300 that illustrates the operation of the phase shifted clock generator 104 in accordance with an embodiment of the present disclosure. The fourth timing diagram 1300 illustrates the operation of the phase shifted clock generator 104 of FIGS. 11 and 12.

During a first cycle of the reference clock signal RCK, the output and reference clock signals OCK and RCK are in phase. In the fourth timing diagram 1300, the cycle starts from a negative half-cycle. When both the output and reference clock signals OCK and RCK are at the logic low state, the first capacitor 208 is discharged and the first control voltage V1 reduces. However, the switch 210 is deactivated and the second control voltage V2 is retained. When the reference clock signal RCK transitions to the logic high state, the switch 210 is activated and the magnitude of the second control voltage V2 is adjusted to be equal to the magnitude of the first control voltage V1, thereby increasing the delay of the delay circuit 202.

During a second cycle of the reference clock signal RCK, the output and reference clock signals OCK and RCK are not in phase. Hence, the logic low state of the reference clock signal RCK may coincide with both the logic states of the output clock signal OCK. Consequently, the first capacitor 208 may be charged and discharged when the output clock signal OCK is at the logic high and low states, respectively. Overall, the first control voltage V1 may still reduce, and when the reference clock signal RCK transitions to the logic high state, the reduction in the first control voltage V1 is reflected in the second control voltage V2, thereby further increasing the delay of the delay circuit 202. The aforementioned operations may continue during third and fourth cycles of the reference clock signal RCK, with the first control voltage V1 reducing and the delay increasing in each cycle.

During a fifth cycle of the reference clock signal RCK, the phase difference between the output and reference clock signals OCK and RCK may be such that the first capacitor 208 may be charged for half of the logic low state of the reference clock signal RCK and discharged for the other half. As the charging and discharging currents are same, the second control voltage V2 may remain unchanged. The delay of the delay circuit 202 is thus controlled based on the second control voltage V2 (and in turn, the first control voltage V1) such that the phase difference between the output and reference clock signals OCK and RCK is within the predefined range.

The circuit diagram of the delay circuit 202 is not illustrated in FIGS. 3, 5, 6, 8, 9, 11, and 12 to keep the illustration concise and clear. Additionally, although each of the first through fourth timing diagrams 400, 700, 1000, and 1300 shows that the phase shifted clock generator 104 attains the steady state during the fifth cycle of the reference clock signal RCK, the scope of the present disclosure is not limited to it. In various embodiments, the phase shifted clock generator 104 may require more than or less than five cycles to attain the steady state.

Thus, the phase shifted clock generator 104 does not utilize complex and large-size circuitries to generate the phase shifted clock signal (e.g., the output clock signal OCK). Hence, the complexity and the size of the phase shifted clock generator 104 are less than that of a conventional phase shifted clock generator that utilizes various complex and large-size circuitries to generate the phase shifted clock signal. Consequently, the power consumption of the phase shifted clock generator 104 is less than that of the conventional phase shifted clock generator. As a result, the phase shifted clock generator 104 may be utilized for low-power applications (e.g., wearable devices).

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

The invention claimed is:

1. An integrated circuit (IC), comprising:
a phase shifted clock generator, comprising:
a delay circuit configured to receive a reference clock signal and generate a first phase shifted clock signal, wherein a phase difference between the first phase shifted clock signal and the reference clock signal is controlled based on a delay of the delay circuit;
a first capacitor; and
a control circuit that is coupled to the first capacitor, and configured to control, based on the first phase shifted clock signal and the reference clock signal, a first control voltage generated at the first capacitor, wherein the control circuit controls the first control voltage by at least one of a group consisting of charging and discharging the first capacitor, and wherein the delay of the delay circuit is controlled based on the first control voltage such that the phase difference between the first phase shifted clock signal and the reference clock signal is within a predefined range; wherein the delay circuit is further configured to receive a second control voltage that is derived from the first control voltage, and the delay of the delay circuit is further controlled based on a magnitude of the second control voltage, wherein the phase shifted clock generator further comprises a switch that is coupled to the first capacitor and the delay circuit, wherein the switch is controlled based on one of a group consisting of (i) the reference clock signal and (ii) a second phase shifted clock signal that is derived from and is in phase with the first phase shifted clock signal, and wherein (i) when the switch is activated, the magnitude of the second control voltage is equivalent to a magnitude of the first control voltage, and (ii) when the switch is deactivated, the magnitude of the second control voltage is retained.

2. The IC of claim 1, wherein the delay circuit comprises:
a plurality of series-coupled inverters configured to receive the reference clock signal and generate the first phase shifted clock signal; and
a plurality of transistors coupled to the plurality of series-coupled inverters, wherein each transistor is configured to receive a second control voltage that is derived from the first control voltage, wherein the delay of the delay circuit corresponds to a sum of a delay associated with each transistor of the plurality of transistors, and wherein the delay associated with each transistor is controlled based on a magnitude of the second control voltage.

3. The IC of claim 1, wherein the delay of the delay circuit is controlled based on the magnitude of the second control voltage such that a reduction in the magnitude of the second control voltage results in an increase in the delay of the delay circuit.

4. The IC of claim 1, wherein the phase shifted clock generator further comprises (i) a pair of series-coupled inverters that is coupled to the delay circuit, and configured to receive the first phase shifted clock signal and generate the second phase shifted clock signal, and (ii) a second capacitor that is coupled to the switch and the delay circuit, with the magnitude of the second control voltage being retained by way of the second capacitor.

5. The IC of claim 1, wherein based on a logic high state of the second phase shifted clock signal, the switch is deactivated and the control circuit controls the first control voltage such that the first capacitor is discharged and charged based on a logic high state and a logic low state of the reference clock signal, respectively, and wherein based on a transition of the second phase shifted clock signal to a logic low state, the switch is activated and the second control voltage is adjusted to be at the same magnitude as the first control voltage.

6. The IC of claim 1, wherein based on a logic high state of the reference clock signal, the switch is deactivated and the control circuit controls the first control voltage such that the first capacitor is charged and discharged based on a logic low state and a logic high state of the second phase shifted clock signal, respectively, and wherein based on a transition of the reference clock signal to a logic low state, the switch is activated and the second control voltage is adjusted to be at the same magnitude as the first control voltage.

7. The IC of claim 1, wherein based on a logic low state of the second phase shifted clock signal, the switch is deactivated and the control circuit controls the first control voltage such that the first capacitor is discharged and charged based on a logic low state and a logic high state of the reference clock signal, respectively, and wherein based on a transition of the second phase shifted clock signal to a logic high state, the switch is activated and the second control voltage is adjusted to be at the same magnitude as the first control voltage.

8. The IC of claim 1, wherein based on a logic low state of the reference clock signal, the switch is deactivated and the control circuit controls the first control voltage such that the first capacitor is charged and discharged based on a logic high state and a logic low state of the second phase shifted clock signal, respectively, and wherein based on a transition of the reference clock signal to a logic high state, the switch is activated and the second control voltage is adjusted to be at the same magnitude as the first control voltage.

9. The IC of claim 1, wherein the control circuit comprises (i) a plurality of series-coupled transistors comprising a first transistor, a second transistor, a third transistor, and a fourth transistor, with the second transistor and the third transistor being coupled to the first capacitor, (ii) a current source coupled to the first transistor, and (iii) a current sink coupled to the fourth transistor, wherein the fourth transistor is controlled based on a second phase shifted clock signal that is derived from and is in phase with the first phase shifted clock signal, the first transistor is controlled based on an inverted version of the second phase shifted clock signal, and each of the second transistor and the third transistor is controlled based on the reference clock signal, wherein based on a logic high state of the second phase shifted clock signal and a logic high state of the reference clock signal, (i) the first transistor, the third transistor, and the fourth transistor are activated, (ii) the second transistor is deactivated, and (iii) the first capacitor is discharged by way of the current sink, and wherein based on the logic high state of the second phase shifted clock signal and a logic low state of the reference clock signal, (i) the first transistor, the second transistor, and the fourth transistor are activated, (ii) the third transistor is deactivated, and (iii) the first capacitor is charged by way of the current source.

10. The IC of claim 1, wherein the control circuit comprises (i) a plurality of series-coupled transistors comprising a first transistor, a second transistor, a third transistor, and a fourth transistor, with the second transistor and the third transistor being coupled to the first capacitor, (ii) a current source coupled to the first transistor, and (iii) a current sink coupled to the fourth transistor, wherein the fourth transistor and the first transistor are controlled based on the reference clock signal and an inverted version of the reference clock signal, respectively, and each of the second transistor and the third transistor is controlled based on a second phase shifted clock signal that is derived from and is in phase with the first phase shifted clock signal, wherein based on a logic high state of the reference clock signal and a logic high state of the second phase shifted clock signal, (i) the first transistor, the third transistor, and the fourth transistor are activated, (ii) the second transistor is deactivated, and (iii) the first capacitor is discharged by way of the current sink, and wherein based on the logic high state of the reference clock signal and a logic low state of the second phase shifted clock signal, (i) the first transistor, the second transistor, and the fourth transistor are activated, (ii) the third transistor is deactivated, and (i) the first capacitor is charged by way of the current source.

11. The IC of claim 1, wherein the control circuit comprises (i) a plurality of series-coupled transistors comprising a first transistor, a second transistor, a third transistor, and a fourth transistor, with the second transistor and the third transistor being coupled to the first capacitor, (ii) a current source coupled to the first transistor, and (iii) a current sink coupled to the fourth transistor, wherein the first transistor is controlled based on a second phase shifted clock signal that is derived from and is in phase with the first phase shifted clock signal, the fourth transistor is controlled based on an inverted version of the second phase shifted clock signal, and each of the second transistor and the third transistor is controlled based on an inverted version of the reference clock signal, wherein based on a logic low state of the second phase shifted clock signal and a logic low state of the reference clock signal, (i) the first transistor, the third transistor, and the fourth transistor are activated, (ii) the second transistor is deactivated, and (iii) the first capacitor is discharged by way of the current sink, and wherein based on the logic low state of the second phase shifted clock signal and a logic high state of the reference clock signal, (i) the first transistor, the second transistor, and the fourth transistor are activated, (ii) the third transistor is deactivated, and (iii) the first capacitor is charged by way of the current source.

12. The IC of claim 1, wherein the control circuit comprises (i) a plurality of series-coupled transistors comprising a first transistor, a second transistor, a third transistor, and a fourth transistor, with the second transistor and the third transistor being coupled to the first capacitor, (ii) a current source coupled to the first transistor, and (iii) a current sink coupled to the fourth transistor, wherein the first transistor and the fourth transistor are controlled based on the reference clock signal and an inverted version of the reference clock signal, respectively, and each of the second transistor and the third transistor is controlled based on an inverted version of a second phase shifted clock signal that is derived from and is in phase with the first phase shifted clock signal, wherein based on a logic low state of the reference clock signal and a logic low state of the second phase shifted clock signal, (i) the first transistor, the third transistor, and the fourth transistor are activated, (ii) the second transistor is deactivated, and (iii) the first capacitor is discharged by way of the current sink, and wherein based on the logic low state of the reference clock signal and a logic high state of the second phase shifted clock signal, (i) the first transistor, the second transistor, and the fourth transistor are activated, (ii) the third transistor is deactivated, and (iii) the first capacitor is charged by way of the current source.

13. The IC of claim 1, wherein the control circuit comprises (i) a first transistor and a second transistor that are coupled in series and further coupled to the first capacitor, (ii) a first current source configured to source a first current to the first transistor, (iii) a first current sink configured to sink a second current from the second transistor, and (iv) a second current source, a second current sink, a third transistor, and a fourth transistor, with the third transistor being coupled between the first current source and the second current sink and the fourth transistor being coupled between the second current source and the first current sink, wherein the first transistor, the second transistor, the third transistor, and the fourth transistor are controlled based on a first trigger signal, a second trigger signal, an inverted version of the first trigger signal, and an inverted version of the second trigger signal, respectively, wherein (i) based on a logic low state of the first trigger signal, the first transistor and the third transistor are activated and deactivated, respectively, and the first capacitor is charged by way of the first current source, and (ii) based on a logic high state of the first trigger signal, the first transistor and the third transistor are deactivated and activated, respectively, and a flow of the first current is continued by way of the third transistor and the second current sink, and wherein (i) based on a logic high state of the second trigger signal, the second transistor and the fourth transistor are activated and deactivated, respectively, and the first capacitor is discharged by way of the first current sink, and (ii) based on a logic low state of the second trigger signal, the second transistor and the fourth transistor are deactivated and activated, respectively, and a flow of the second current is continued by way of the fourth transistor and the second current source.

14. The IC of claim 13, wherein (i) the first trigger signal is at the logic low state based on a logic low state of the reference clock signal and a logic high state of a second phase shifted clock signal that is derived from and is in phase with the first phase shifted clock signal, and (ii) the first trigger signal is at the logic high state based on at least one of a group consisting of a logic high state of the reference clock signal and a logic low state of the second phase shifted clock signal, and wherein (i) the second trigger signal is at the logic high state based on the logic high state of the reference clock signal and the logic high state of the second phase shifted clock signal, and (ii) the second trigger signal is at the logic low state based on at least one of a group consisting of the logic low state of the reference clock signal and the logic low state of the second phase shifted clock signal.

15. The IC of claim 13, wherein (i) the first trigger signal is at the logic low state based on a logic high state of the reference clock signal and a logic low state of a second phase shifted clock signal that is derived from and is in phase with the first phase shifted clock signal, and (ii) the first trigger signal is at the logic high state based on at least one of a group consisting of a logic low state of the reference clock signal and a logic high state of the second phase shifted clock signal, and wherein (i) the second trigger signal is at the logic high state based on the logic high state of the reference clock signal and the logic high state of the second phase shifted clock signal, and (ii) the second trigger signal is at the logic low state based on at least one of a group consisting of the logic low state of the reference clock signal and the logic low state of the second phase shifted clock signal.

16. The IC of claim 13, wherein (i) the first trigger signal is at the logic low state based on a logic high state of the reference clock signal and a logic low state of a second phase shifted clock signal that is derived from and is in phase with the first phase shifted clock signal, and (ii) the first trigger signal is at the logic high state based on at least one of a group consisting of a logic low state of the reference clock signal and a logic high state of the second phase shifted clock signal, and wherein (i) the second trigger signal is at the logic high state based on the logic low state of the reference clock signal and the logic low state of the second phase shifted clock signal, and (ii) the second trigger signal is at the logic low state based on at least one of a group consisting of the logic high state of the reference clock signal and the logic high state of the second phase shifted clock signal.

17. The IC of claim 13, wherein (i) the first trigger signal is at the logic low state based on a logic low state of the reference clock signal and a logic high state of a second phase shifted clock signal that is derived from and is in phase with the first phase shifted clock signal, and (ii) the first trigger signal is at the logic high state based on at least one of a group consisting of a logic high state of the reference clock signal and a logic low state of the second phase shifted clock signal, and wherein (i) the second trigger signal is at the logic high state based on the logic low state of the reference clock signal and the logic low state of the second phase shifted clock signal, and (ii) the second trigger signal is at the logic low state based on at least one of a group consisting of the logic high state of the reference clock signal and the logic high state of the second phase shifted clock signal.

18. The IC of claim 1, wherein in a steady state of the phase shifted clock generator, the first control voltage is controlled such that a change in the first control voltage during the charging of the first capacitor is equal to and inverse of a change in the first control voltage during the discharging of the first capacitor.

19. An integrated circuit (IC), comprising:
a phase shifted clock generator, comprising:
  a delay circuit comprising (i) a plurality of series-coupled inverters configured to receive a reference clock signal and generate a first phase shifted clock signal and (ii) a plurality of transistors coupled to the plurality of series-coupled inverters, wherein a phase difference between the first phase shifted clock signal and the reference clock signal is controlled based on a delay associated with each transistor;
  a first capacitor;
  a control circuit that is coupled to the first capacitor, and configured to control, based on the first phase shifted clock signal and the reference clock signal, a first control voltage generated at the first capacitor by at least one of a group consisting of charging and discharging the first capacitor, wherein the delay associated with each transistor of the plurality of transistors is controlled based on a magnitude of a second control voltage that is derived from the first control voltage; and
  a switch that is coupled to the first capacitor and the delay circuit, wherein when the control circuit is controlling the first control voltage, the switch is deactivated and the magnitude of the second control voltage is retained, and when the first capacitor retains an associated charge, the switch is activated and the magnitude of the second control voltage is equivalent to a magnitude of the first control voltage, and wherein the delay associated with each transistor is controlled such that the phase difference between the first phase shifted clock signal and the reference clock signal is within a predefined range.

* * * * *